US011001044B2

(12) United States Patent
Makino et al.

(10) Patent No.: US 11,001,044 B2
(45) Date of Patent: May 11, 2021

(54) PEEL-OFF DEVICE

(71) Applicant: NIKKISO CO., LTD., Tokyo (JP)

(72) Inventors: Toru Makino, Higashimurayama (JP); Tomoyo Sawada, Higashimurayama (JP); Takahiro Mori, Higashimurayama (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 16/704,047

(22) Filed: Dec. 5, 2019

(65) Prior Publication Data
US 2020/0238678 A1    Jul. 30, 2020

(30) Foreign Application Priority Data

Jan. 30, 2019  (JP) .............................. JP2019-014751

(51) Int. Cl.
*B32B 43/00* (2006.01)

(52) U.S. Cl.
CPC .......... *B32B 43/006* (2013.01); *B32B 43/003* (2013.01); *B32B 2309/06* (2013.01); *B32B 2457/16* (2013.01); *Y10T 156/1132* (2015.01); *Y10T 156/1137* (2015.01); *Y10T 156/1168* (2015.01); *Y10T 156/1184* (2015.01); *Y10T 156/1939* (2015.01); *Y10T 156/1944* (2015.01); *Y10T 156/1967* (2015.01); *Y10T 156/1978* (2015.01)

(58) Field of Classification Search
CPC . B32B 38/10; B32B 43/006; Y10T 156/1132; Y10T 156/1137; Y10T 156/1168; Y10T 156/1184; Y10T 156/1939; Y10T 156/1944; Y10T 156/1967; Y10T 156/1978
See application file for complete search history.

(56) References Cited

U.S. PATENT DOCUMENTS

| | | | | |
|---|---|---|---|---|
| 5,282,918 A | * | 2/1994 | Heist ...................... | B26D 3/282 156/765 |
| 5,676,789 A | * | 10/1997 | Hamamura ......... | B29C 63/0013 156/714 |
| 6,503,130 B2 | * | 1/2003 | Lim ........................ | B24B 37/34 156/716 |
| 8,074,696 B2 | * | 12/2011 | Furukubo ............. | B28B 11/006 156/708 |
| 9,227,812 B2 | * | 1/2016 | Degawa .................. | B32B 38/10 |
| 9,511,578 B2 | * | 12/2016 | Lv .......................... | B32B 43/006 |

(Continued)

FOREIGN PATENT DOCUMENTS

| | | |
|---|---|---|
| JP | H04-189260 A | 7/1992 |
| JP | H09-309664 A | 12/1997 |

(Continued)

OTHER PUBLICATIONS

Nov. 4, 2020 Office Action issued in Japanese Patent Application No. 2019-014751.

*Primary Examiner* — Mark A Osele
*Assistant Examiner* — Nickolas R Harm
(74) *Attorney, Agent, or Firm* — Oliff PLC

(57) ABSTRACT

A blade includes an edge to be pressed against an end portion of a carrier film to fold the end portion upwards from a sheet. A clamp mechanism peels the carrier film off from the sheet by moving while clamping the upwardly folded end portion of the carrier film.

7 Claims, 19 Drawing Sheets

(56) References Cited

U.S. PATENT DOCUMENTS

| | | | | |
|---|---|---|---|---|
| 9,805,953 B2* | 10/2017 | Ohno | | H01L 21/6838 |
| 9,902,584 B2* | 2/2018 | Kramer | | B65H 18/10 |
| 10,173,408 B2* | 1/2019 | Tateyama | | B32B 43/006 |
| 2004/0166653 A1* | 8/2004 | Kerdiles | | G01N 19/04 |
| | | | | 438/458 |
| 2006/0113595 A1* | 6/2006 | Ohkawara | | H01L 21/67132 |
| | | | | 257/347 |
| 2007/0261783 A1* | 11/2007 | Larson | | B29C 63/0013 |
| | | | | 156/247 |
| 2007/0269962 A1* | 11/2007 | Kawashima | | B29C 63/0013 |
| | | | | 438/464 |
| 2011/0198040 A1* | 8/2011 | Ebata | | B65H 41/00 |
| | | | | 156/750 |
| 2012/0312481 A1* | 12/2012 | Kang | | B29C 63/0013 |
| | | | | 156/715 |
| 2013/0206331 A1* | 8/2013 | Ho | | B26F 3/004 |
| | | | | 156/247 |
| 2015/0059987 A1* | 3/2015 | Kumakura | | H01L 21/67092 |
| | | | | 156/714 |
| 2015/0101758 A1* | 4/2015 | Honda | | H01L 21/67092 |
| | | | | 156/714 |
| 2015/0217557 A1* | 8/2015 | Lee | | B32B 43/006 |
| | | | | 156/707 |
| 2015/0258767 A1* | 9/2015 | Asakawa | | B32B 43/006 |
| | | | | 156/718 |
| 2015/0261206 A1* | 9/2015 | Shiino | | B25J 9/1694 |
| | | | | 700/257 |
| 2016/0176181 A1* | 6/2016 | Kim | | B32B 43/006 |
| | | | | 156/701 |
| 2017/0326865 A1* | 11/2017 | Ayabe | | B32B 38/10 |
| 2017/0348961 A1* | 12/2017 | Choi | | B32B 43/006 |

FOREIGN PATENT DOCUMENTS

| | | |
|---|---|---|
| JP | 2006-290608 A | 10/2006 |
| JP | 2010-042922 A | 2/2010 |
| JP | 2010-247985 A | 11/2010 |
| JP | 2013-234063 A | 11/2013 |
| JP | 2015-083504 A | 4/2015 |
| JP | 6324606 B1 | 5/2018 |

\* cited by examiner

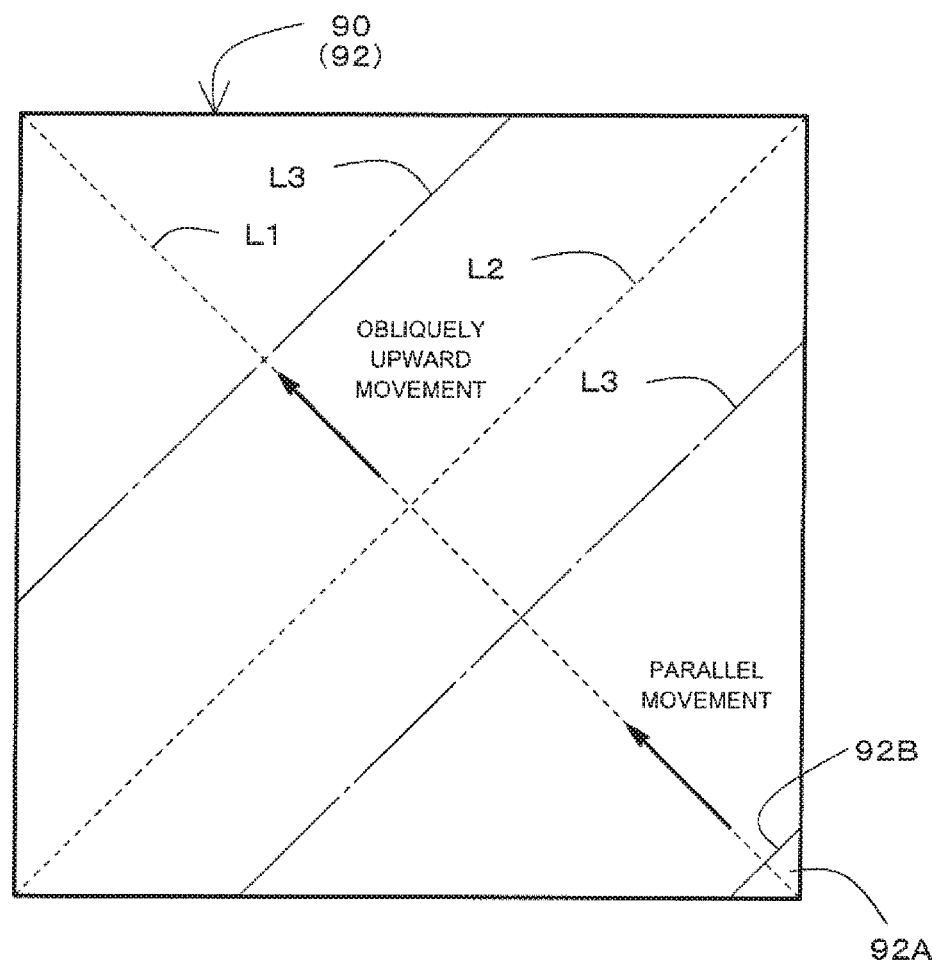
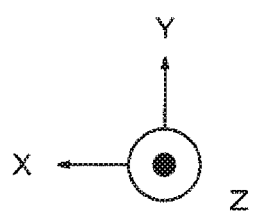
FIG. 16

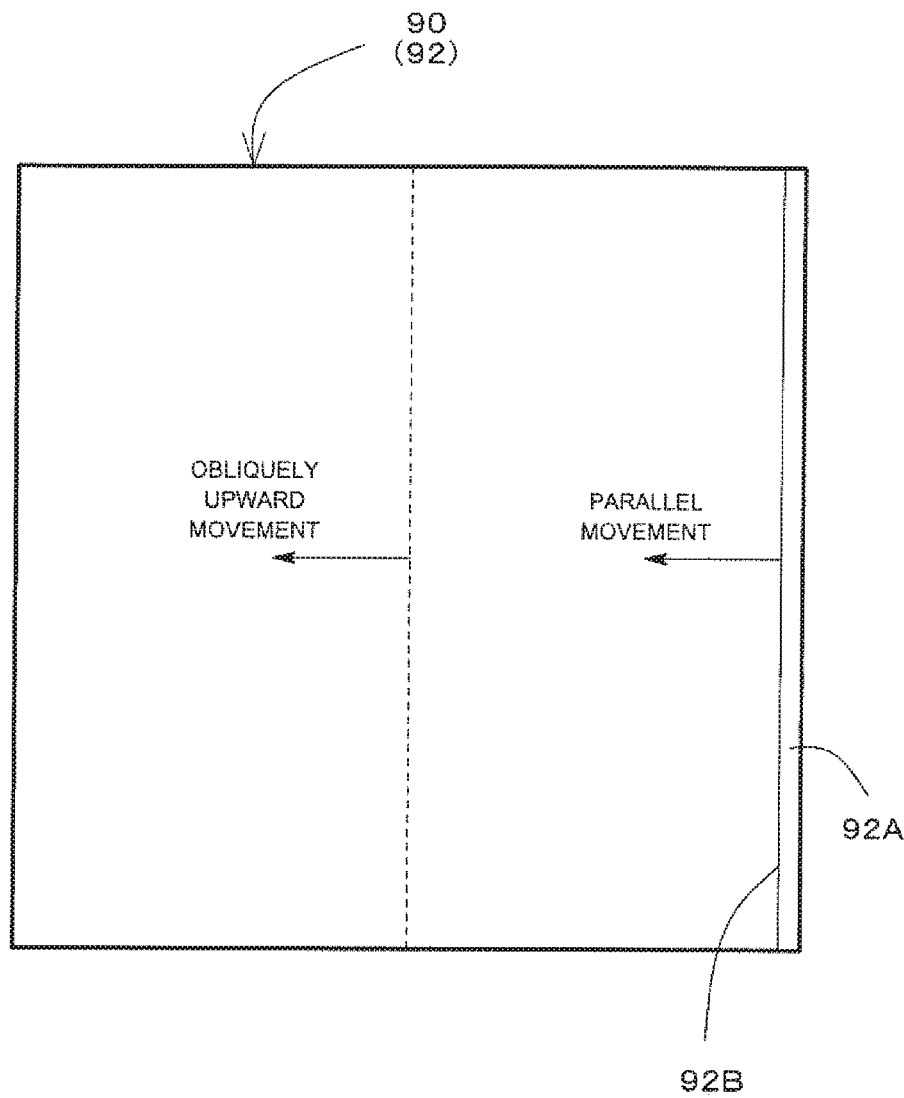
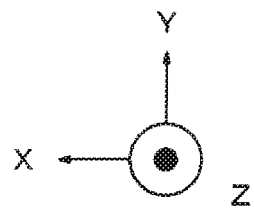
FIG. 19

PEEL-OFF DEVICE

CROSS REFERENCE TO RELATED APPLICATION

This application claims priority to Japanese Patent Application No. 2019-014751 filed on Jan. 30, 2019, which is incorporated herein by reference in its entirety including the specification, claims, drawings, and abstract.

TECHNICAL FIELD

The present disclosure relates to a peel-off device for peeling a sheet off from a carrier film that is a base layer in a laminated film.

BACKGROUND

In manufacturing a circuit element, such as a laminated ceramic chip capacitor, a dielectric sheet on which a conductor pattern is printed is used. In order to prepare a dielectric sheet, a paste-type dielectric material is applied on a base film layer called a carrier film. Then, a metal paste is screen printed or otherwise deposited on the applied dielectric material.

During the manufacture of the circuit element, the dielectric sheet is separated from the carrier film. For example, a laminated film including the carrier film and the dielectric sheet is fed to a peel-off device which peels the dielectric sheet off from the carrier film.

For example, in JP 2015-83504A, end portions are cut off from a board whose surface is covered by a protective layer. While end portions of the board are cut off, the protective layer remains unseparated. In this way, the end portions of the board that have been cut off can be used as a holding margin to peel the protective layer off from the board.

For another example, in JP Patent No. 6,324,606, when peeling off a coverlay film protecting a conductor pattern from a release film that is a protective film, a pre-peel-off roll is pressed against the coverlay film to raise the coverlay film from the protective film. The raised portion is used as a peeling start point.

When the end portions of a board are cut, the cut end portions may be separated from the protective layer and scattered around the peel-off device as chips. In addition, when the roll is pressed against the coverlay film, because the roll is in direct contact with the coverlay film, the coverlay film may be damaged.

An object of the present disclosure is to provide a peel-off device that can reduce chips and damages of a sheet when peeling the sheet off from a carrier film that is a base layer.

SUMMARY

The present disclosure relates to a peel-off device. The peel-off device includes a sheet table, a blade, and a clamp mechanism. The sheet table suctions a lamination sheet in which a sheet is laminated to a carrier film that is a base layer, with a surface of the sheet serving as a suction surface of the lamination sheet, and a surface of the carrier film serving as an exposed surface of the lamination sheet. The blade includes an edge that is pressed against an end portion of the carrier film to fold the end portion upwards from the sheet. The clamp mechanism peels the carrier film off from the sheet by moving while clamping the upwardly folded end portion of the carrier film.

According to the above configuration, the end portion of the carrier film is folded upwards by pressing the edge of the blade against the end portion. Such an upward folding; that is, a plastic deformation, maintains the end portion of the carrier film to be spaced apart from the sheet. The carrier film is peeled off from the sheet by the blade which moves while holding the end portion.

According to one aspect of the present disclosure, the edge angle of the blade may be within a range from 25 to 60 degrees.

When the edge angle of the blade is too narrow, the end portion of the film may be accidentally cut off. In contrast, when the edge angle is too wide, the upward folding may fail to be formed. By using the blade of the edge angle within a range from 25° to 60°, the risk of the cutting of the end portion of the carrier film may be reduced, while the upward folding of the end portion can be ensured.

According to another aspect of the present disclosure, the peel-off device may further include a controller that controls the clamp mechanism. The controller may perform a parallel movement control and an oblique movement control. In the parallel movement control, the clamp mechanism is moved in parallel to the exposed surface of the lamination sheet after the end portion of the carrier film is clamped by the clamp mechanism. In the oblique movement control, after the parallel control, the clamp mechanism is moved away from the exposed surface in a direction that is tilted with respect to the exposed surface.

When the carrier film is peeled off from the sheet while the lamination sheet is suctioned to the sheet table, the lamination sheet itself may be detached from the sheet table if the clamp mechanism is moved perpendicular to the exposed surface of the lamination sheet; in other words, in a direction opposite to the suction direction. Furthermore, if the carrier film is overbent, the carrier film may spring back by an elastic force, damaging the sheet when a trailing end portion of the carrier film is peeled off from the sheet in a final stage of the peel-off process. By moving the clamp mechanism in parallel to the exposed surface of the lamination sheet in an earlier stage of the peeling-off process as described above, the risk of detachment of the lamination sheet from the sheet table can be reduced. Furthermore, by moving the clamp mechanism away from the exposed surface in a direction that is tilted with respect to the exposed surface in the final stage of the peeling-off process, the bending of the carrier film can be moderate, reducing the damage to the sheet.

According to yet another aspect of the present disclosure, the clamp mechanism may include a raising claw that has a protrusion protruding in parallel to the exposed surface of the lamination sheet, and a clamping claw that faces the raising claw and is moveable relative to the raising claw. The controller may perform a film raising control that promotes peeling off of the carrier film from the sheet before performing the parallel movement control. In the film raising control, the controller positions the protrusion of the raising claw in a gap between the end portion of the carrier film and the sheet while the raising claw is spaced apart from the clamping claw, and reciprocates the raising claw in parallel to the exposed surface of the lamination sheet.

According to the above configuration, the film raising can promote the peeling off of the carrier film further towards the inner side from the end portion, and facilitate holding of the end portion by the clamp mechanism.

According to yet another aspect of the present disclosure, the peel-off device may further include an air nozzle that jets air into the gap between the end portion of the carrier film and the sheet during the film raising control.

According to the above configuration, the air jet from the air nozzle can promote the peeling off of the carrier film further towards the inner side from the end portion.

According to the present disclosure, generation of chips and damage of a sheet can be reduced when peeling the sheet off from a carrier film that is a base layer.

BRIEF DESCRIPTION OF DRAWINGS

Embodiments of the present disclosure will be described based on the following figures, wherein:

FIG. 16 is a diagram (2/2) to describe a peel-off direction of the carrier film;

FIG. 19 shows another embodiment of a position of a fold line and a peel-off direction.

DESCRIPTION OF EMBODIMENTS

Entire Configuration

Figure 1:
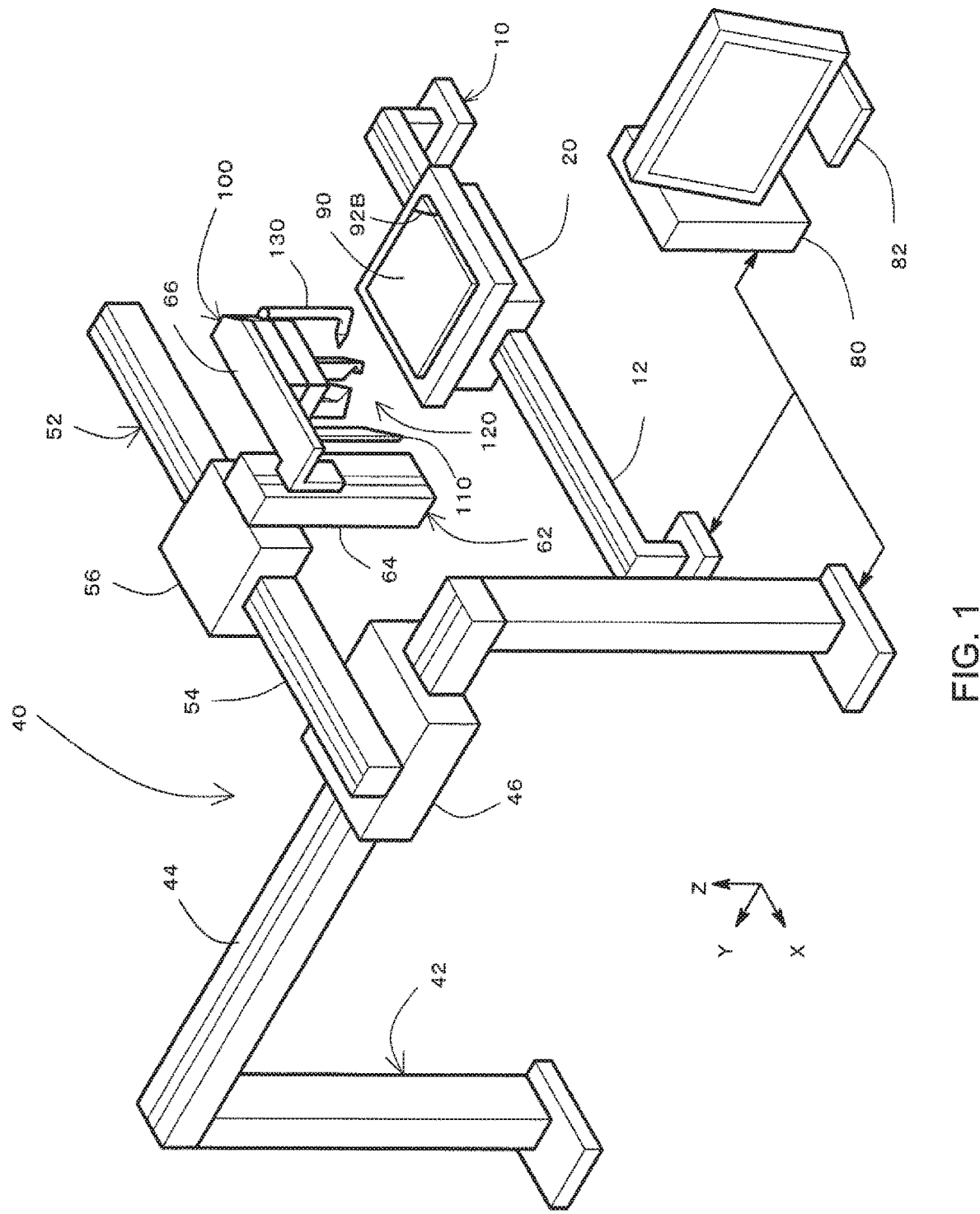
FIG. 1 is a perspective view exemplarily showing a peel-off device according to an embodiment of the present disclosure.

FIG. 1 exemplarily shows a peel-off device according to an embodiment of the present disclosure. The peel-off device includes a sheet stage 10, a catcher stage 40, and a controller 80.

In description below, a moving direction on an x-axis rail 12 of the sheet stage 10 is referred to as an X axis; an axis perpendicular to the X axis in a horizontal plane is referred to as a Y axis; and an axis perpendicular to the X and Y axes (in other words, a vertical axis) is referred to as a Z axis.

Figure 2:
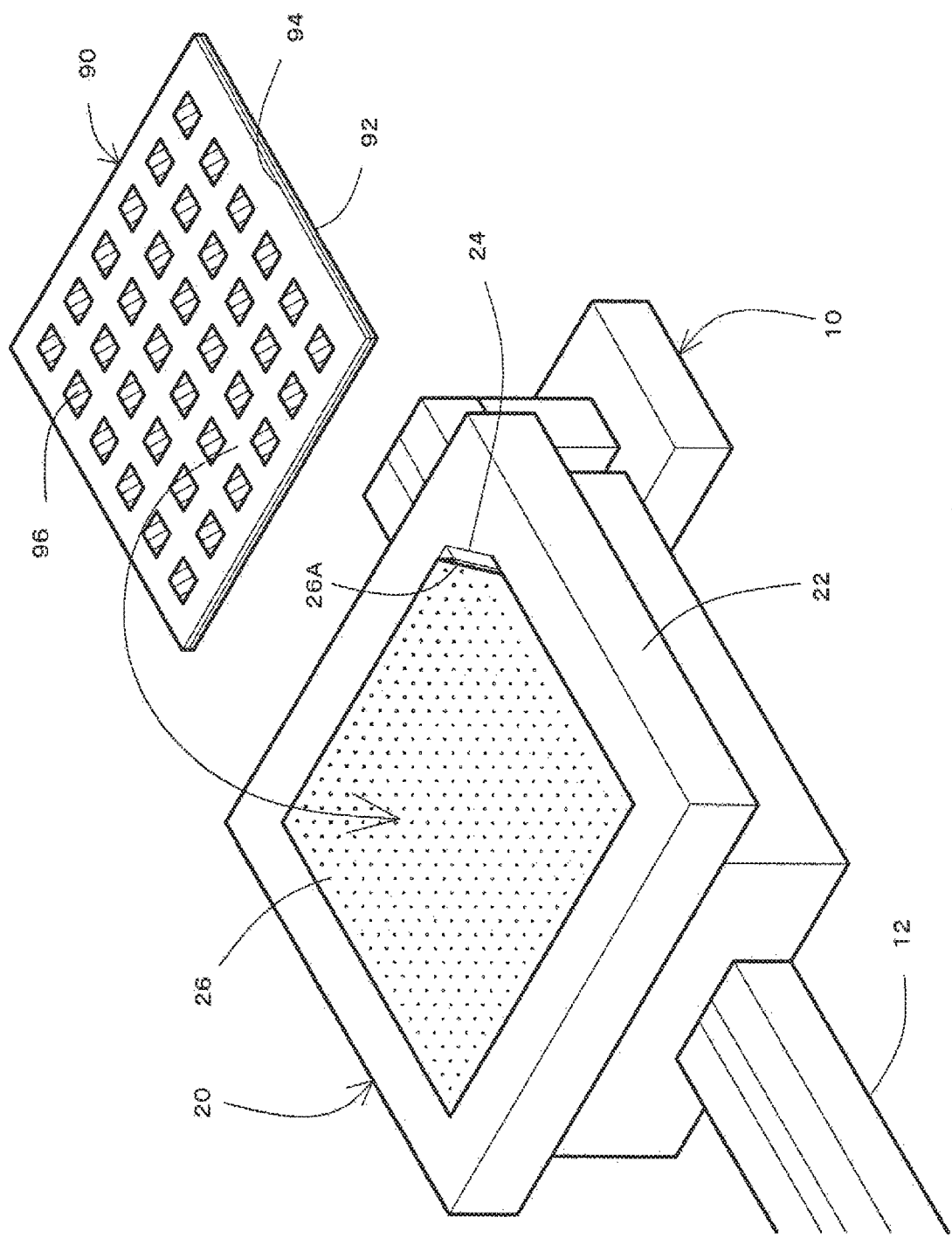
FIG. 2 is a perspective view exemplarily showing a process to suction a lamination sheet to a sheet table.

In the peel-off device according to the present embodiment, a lamination sheet 90 exemplarily shown in FIG. 2 is suctioned, and a carrier film 92 is peeled off from a sheet 94 of the lamination sheet 90. The lamination sheet 90 may be a part of a circuit element, such as a laminated ceramic capacitor, or a part of a substrate on which an LED device is implemented.

In the lamination sheet 90, the sheet 94 is stacked on top of the carrier film 92 that is a base layer. The carrier film 92 is also referred to as a carrier tape. Slurry for forming the sheet is applied on this film. The carrier film 92 may be a poly ethylene terephthalate (PET) film or a poly phenylene sulfide (PPS) film. The thickness of the carrier film 92 may be determined in accordance with the thickness of the stacked sheet 94. For example, with the sheet 94 of a thickness of 50 μm or less, the thickness of the carrier film 92 may be 38 μm, whereas, with the sheet 94 of a thickness over 50 μm, the thickness of the carrier film 92 may be 75 μm.

The sheet 94 may be, for example, a part of a circuit element or a part of a substrate on which a circuit element is implemented. For example, when the sheet 94 is a low temperature co-fired ceramic (LTCC) device, the sheet 94 indicates a circuit element in which an inorganic material such as a ceramic material is dispersed with organic binder. As described above, the sheet 94 is formed by applying, to the carrier film 92, slurry in which an inorganic material is mixed with an organic binder.

Further, conductors are applied to the sheet 94. For example, conductors are screen printed on the sheet 94 to form a pattern. The patterned conductors 96 are spaced apart from each other on the sheet 94. The patterned conductors 96 are disposed away from the edges of the sheet 94. In other words, the portions between the patterned conductors 96 and the edges of the sheet 94 are unnecessary margin portions (to be cut off). As described below, a fold line 92B is formed on the margin portion; that is, an end portion 92A (refer to FIG. 3).

In the lamination sheet 90, an adhesive layer may be disposed between the carrier film 92 and the sheet 94. Alternatively, the carrier film 92 itself may be adhesive.

Although two or more sheets 94 may be laminated, the carrier film 92 may be peeled off before laminating the second and subsequent sheets 94; that is, with the single sheet 94 alone. When two or more sheets 94 are laminated, patterned conductors 96 protrude from the area around them (area with no conductors), reducing evenness in the plane. In other words, the raised portions may be formed on the plane. In contrast, when the single sheet 94 is suctioned to a sheet table 20, the sheet 94 can be more reliably suctioned than the laminated sheets.

As shown in FIG. 2, in the lamination sheet 90, the front surface of the sheet 94; that is, the surface on which the patterned conductors are formed, is the suctioned surface. In contrast, the surface of the carrier film 92 opposite to the surface on which the sheet 94 is formed is an exposed surface. As described further below, damage to the sheet 94 can be reduced by forming the fold line 92B (refer to FIG. 3) not on the sheet 94 but on the carrier film 92.

As shown in FIG. 1, the lamination sheet 90 is transported to the sheet stage 10. The sheet stage 10 may be, for example, a single-axis stage, including the x-axis rail 12 and the sheet table 20. The x-axis rail 12 extends linearly such that the sheet table 20 linearly moves (reciprocates) on the x-axis rail 12.

As described further below, in the peel-off process, the sheet table 20 is firstly moved to a predetermined sheet-receive position. The sheet table 20 receives the lamination sheet 90 from a holder (not shown) at the sheet-receive position, and suctions the lamination sheet 90. Then, the sheet table 20 is moved to a predetermined peel-off position. When the peel-off process of the carrier film 92 from the sheet 94 is completed by a catcher unit 100, the sheet table 20 transports the sheet 94 back to the sheet-receive position. The suction of the sheet table 20 is stopped at this sheet-receive position, and the sheet 94 is passed to another holder (not shown).

As shown in FIG. 2, the sheet table 20 includes a suction plate 26 on a base 22. The suction plate 26 is formed from a porous resin material. Because the suction plate 26 comes in contact with the sheet 94, the contact surface (mounting surface) may be soft so as to protect the sheet 94.

Figure 9:
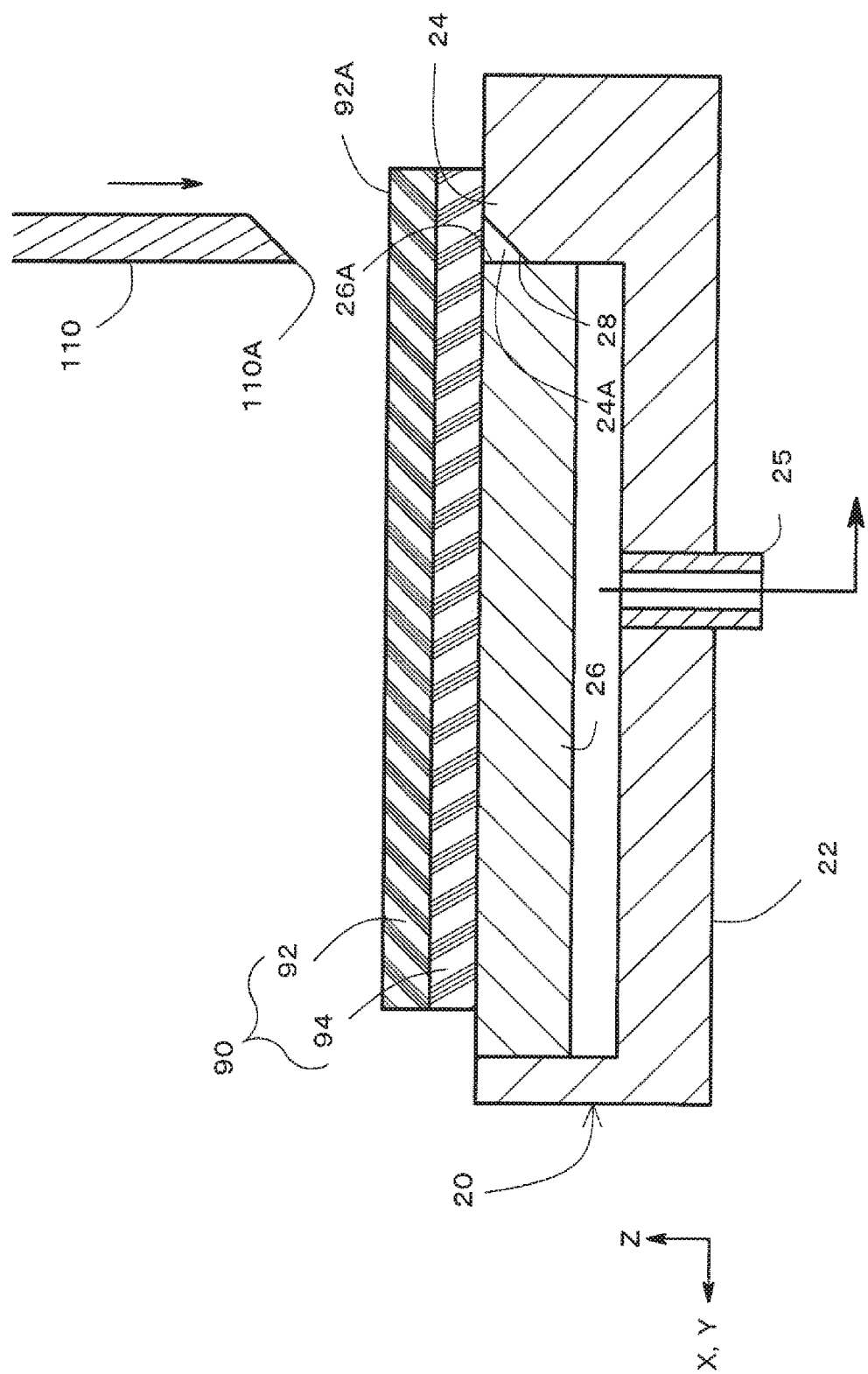
FIG. 9 exemplarily shows a peel-off process (1/7) of a carrier film performed by a peel-off device according to an embodiment of the present disclosure.

As shown in FIG. 9, the base 22 and the suction plate 26 may be spaced apart from each other in a Z axis direction. A negative-pressure tube 25 is disposed in the base 22. An end of the negative-pressure tube 25 is opened to the space between the base 22 and the suction plate 26. By applying a negative pressure from the negative-pressure tube 25, air from the suction plate 26 is suctioned. In this way, a suction force occurs on a mounting surface of the suction plate 26 such that the lamination sheet 90 mounted on the mounting surface is suctioned by the sheet table 20.

Referring back to FIG. 2, a portion of the suction plate 26 is cut off where the base 22 includes a chamfer portion 24 protruding towards the center of the base 22. For example, when the lamination sheet 90 is a rectangular sheet material, a corner of the suction plate 26 is cut off across two adjoining sides such that a cut-off line 26A is angled at 45 degrees to one side of the lamination sheet 90; in other words, in parallel to a diagonal of a surface of the lamination sheet 90.

When the lamination sheet 90 is mounted on the suction plate 26, the cut-off line 26A is formed in the suction plate 26 so that the cut-off line 26A is positioned in the margin portion (with no patterned conductors); that is, on a peripheral edge side of the lamination sheet 90 outward from the patterned conductors 96 of the lamination sheet 90. In such positional relationships, the end portion 92A of the lamination sheet 90 that is positioned over the chamfer portion 24 (refer to FIG. 2) and not on the suction plate 26 is not suctioned by the sheet table 20.

As shown in FIG. 9, a tilted surface 28 is formed at the chamfer portion 24 of the base 22 that faces the cut-off line 26A. For example, the tilted surface 28 may be formed to be tilted downward from an edge of the base 22 towards the center relative to the z-axis. The tilted surface 28 forms a gap 24A between the sheet 94, the suction plate 26, and the chamfer portion 24. As described further below, a blade 110 is lowered from above the gap 24A.

As shown in FIG. 1, the catcher stage 40 moves the catcher unit 100 in three axial directions (along the x, y, and z axes). For example, the catcher stage 40 includes a y-axis stage 42, an x-axis stage 52, and a z-axis stage 62.

The y-axis stage 42 includes a y-axis rail 44 and a y-axis table 46. The y-axis rail 44 linearly extends orthogonal to the x-axis in a horizontal plane. The y-axis table 46 reciprocates on the y-axis rail 44. An x-axis rail 54 of the x-axis stage 52 is fixed to the y-axis table 46.

The x-axis stage 52 includes the x-axis rail 54 and an x-axis table 56. The x-axis rail 54 linearly extends in parallel to the x-axis rail 12 of the sheet stage 10. The x-axis table 56 reciprocates on the x-axis rail 54. A z-axis rail 64 of the z-axis stage 62 is fixed to the x-axis table 56.

The z-axis stage 62 includes the z-axis rail 64 and a z-axis table 66. The z-axis rail 64 linearly extends perpendicular to the x and y axes (in other words, linearly extends vertically). The z-axis table 66 reciprocates on the z-axis rail 64. The z-axis table 66 includes the catcher unit 100.

The y-axis stage 42, the x-axis stage 52, the z-axis stage 62, and the sheet stage 10 may be configured by, for example, linear stages driven by linear motors. In place of the linear motors, ball screw mechanisms or rack and pinion mechanisms may be provided.

Figure 3:
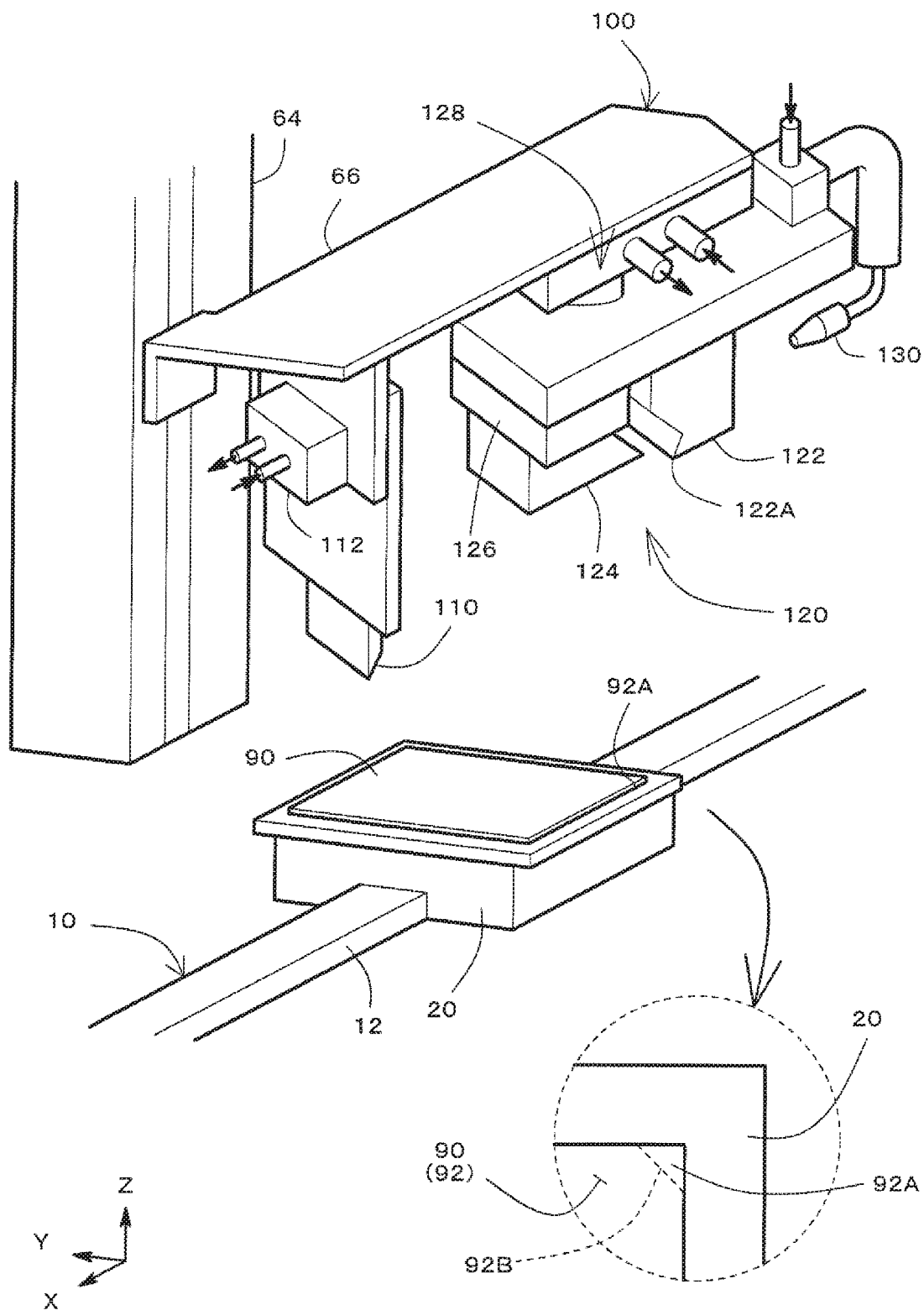
FIG. 3 is a perspective view exemplarily showing details of a catcher unit.

As shown in FIG. 3, the catcher unit 100 includes the blade 110 and a clamp mechanism 120. The blade 110 is supported by the z-axis table 66 via a blade elevating mechanism 112.

The blade elevating mechanism 112 moves the blade 110 up and down (in other words, reciprocates the blade 110 along the z-axis) independently from the z-axis stage 62. The blade elevating mechanism 112 may include, for example, an air cylinder that lowers the blade 110 at a predetermined thrust. As exemplarily shown in FIG. 10, when the blade 110 is pressed against the carrier film 92 of the lamination sheet 90, an edge 110A of the blade 110 is pressed against the end portion 92A of the carrier film 92 at the predetermined thrust. As described further below, the fold line 92B exemplarily shown in FIG. 16 is formed by this pressing in the end portion 92A of the carrier film 92. Then, the end portion 92A is bent upwards from the sheet 94 along the fold line 92B.

Figure 4:
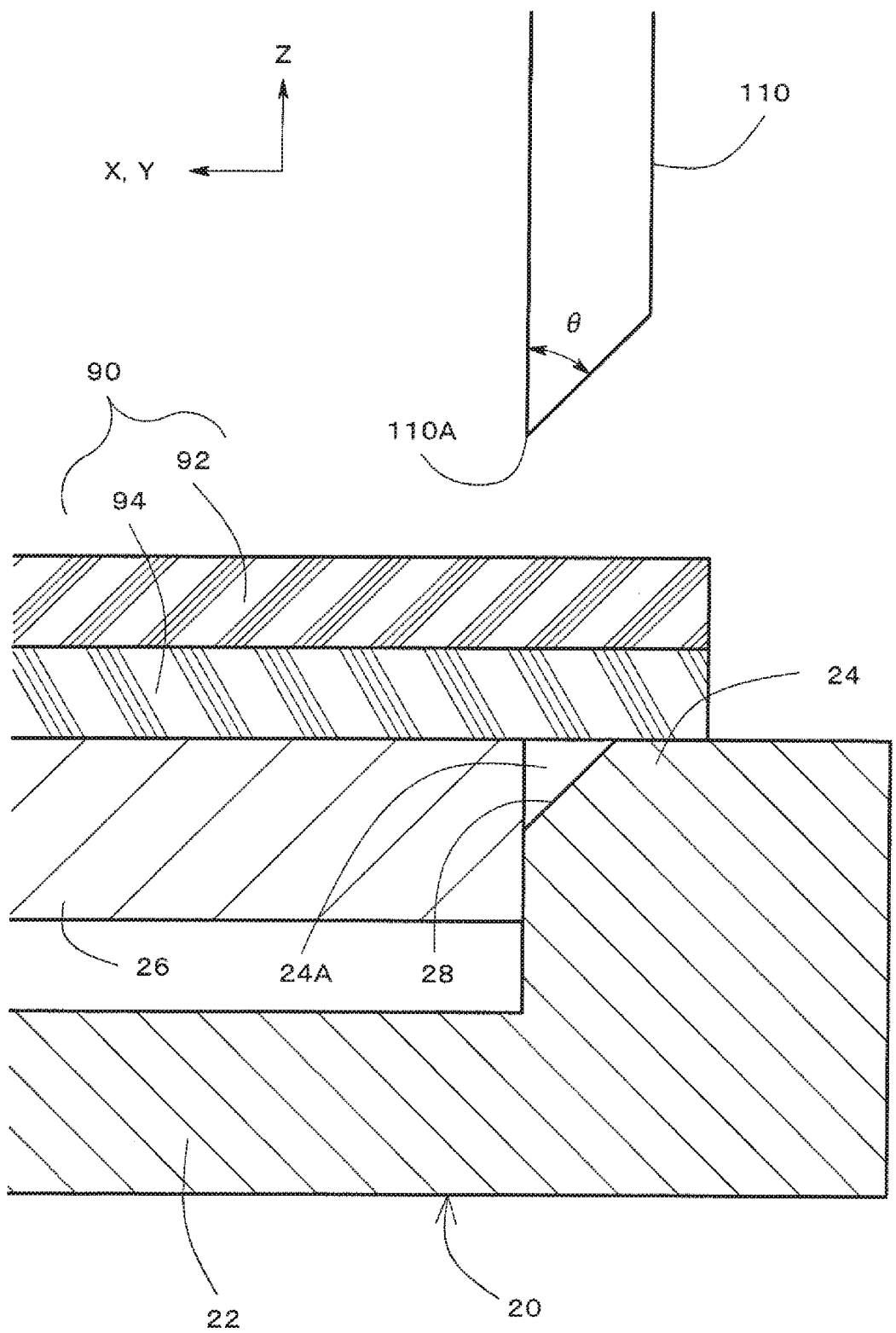
FIG. 4 shows an example of an edge angle of a blade.

As shown in FIGS. 3 and 4, the blade 110 includes the edge 110A at the lower end, whereas the upper end is fixed to the blade elevating mechanism 112. The blade 110 forms the fold line 92B at a predetermined position of the carrier film 92 in the lamination sheet 90. For example, in the peel-off process, when the sheet table 20 is positioned at a predetermined peel-off position, the blade 110 is moved over the gap 24A of the sheet table 20. Then, as exemplarily shown in FIG. 3, the orientation (angle) of the blade 110 is determined to be positioned across a corner over two adjoining sides in the end portion 92A of the carrier film 92 in the lamination sheet 90. For example, the angle of the blade 110 is determined such that the blade 110 is positioned at 45 degrees to the x and y axes.

Figure 5:
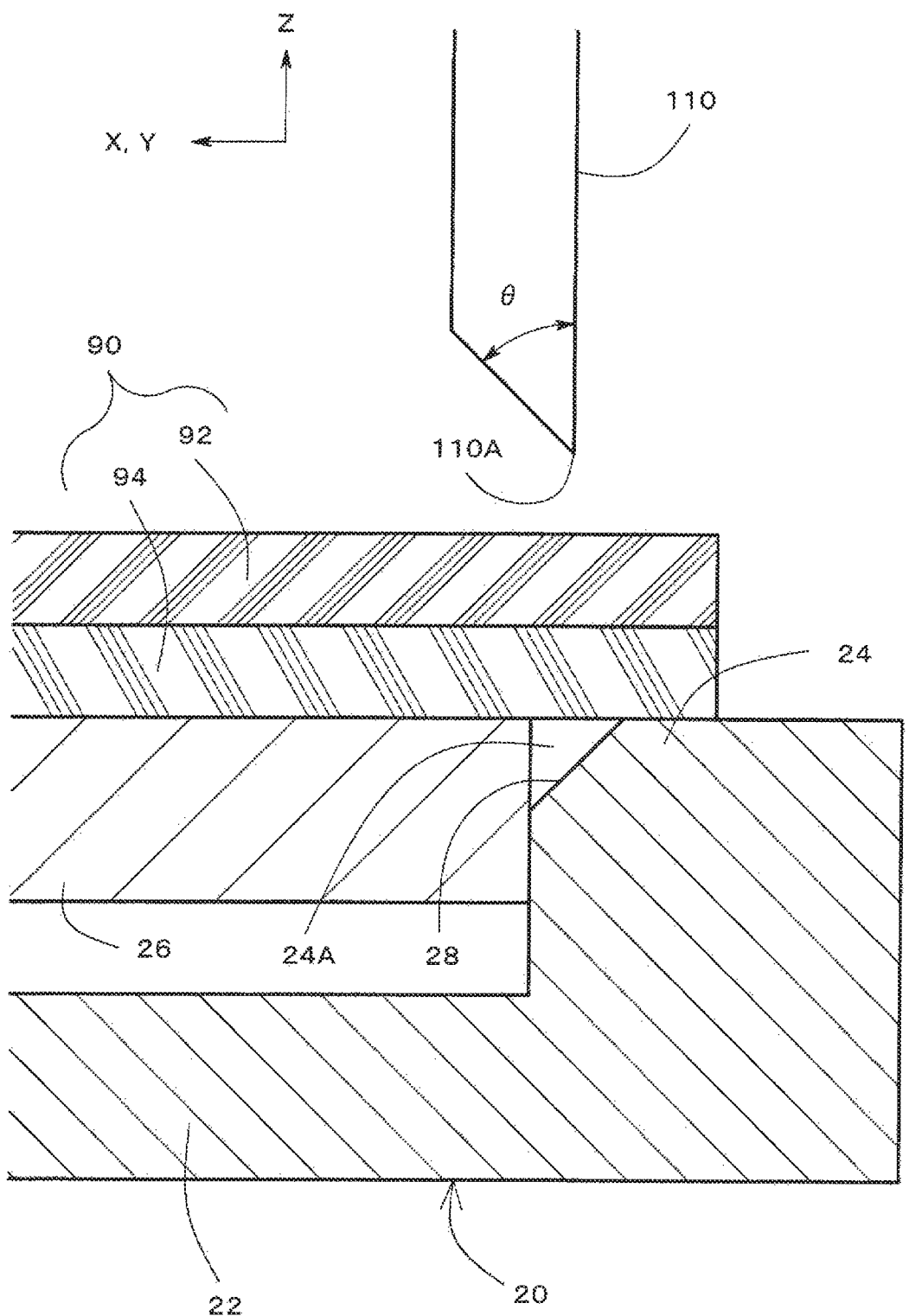
FIG. 5 shows another example of the edge angle of the blade.
Figure 6:
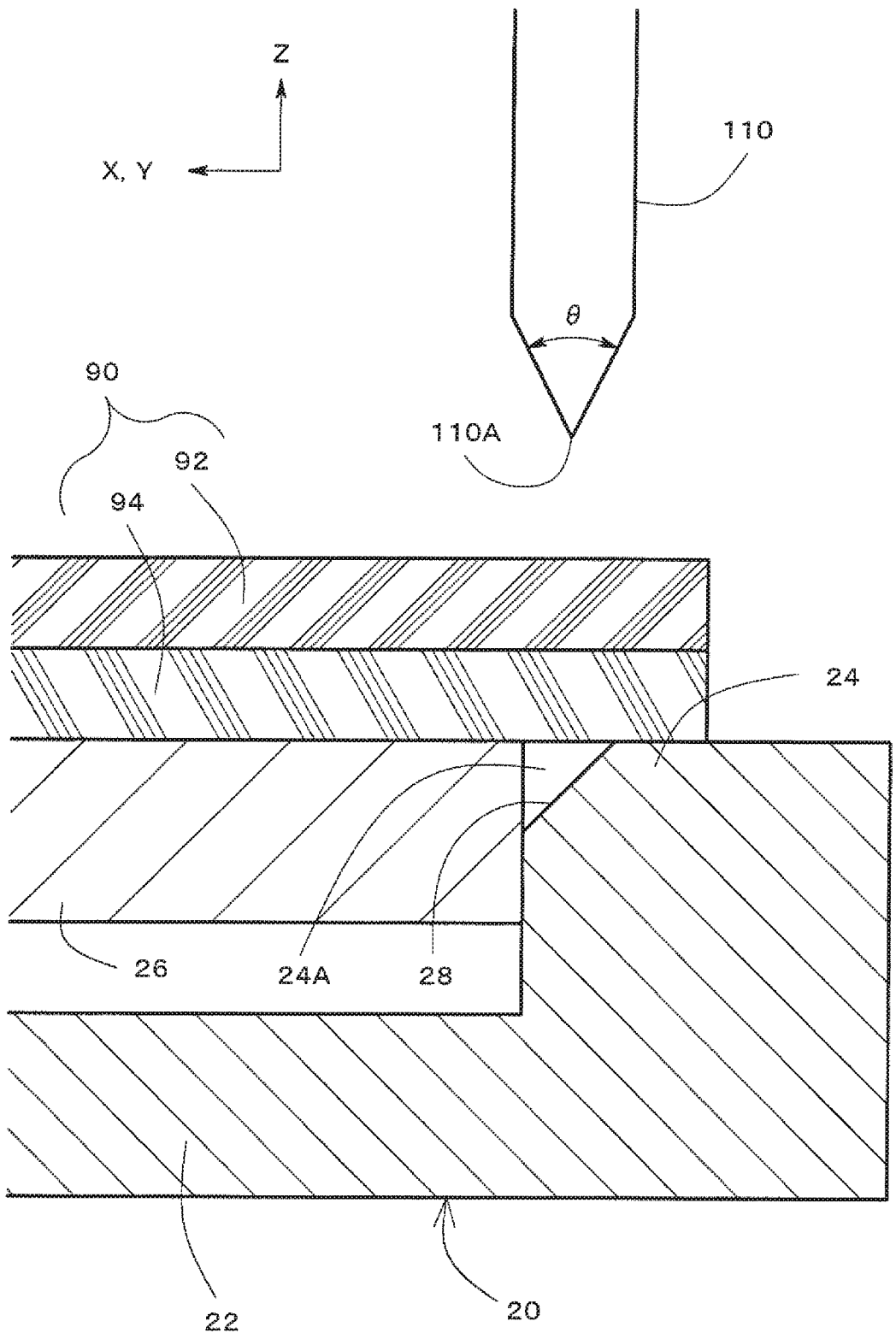
FIG. 6 shows yet another example of the edge angle of the blade.

As shown in FIG. 4, the edge 110A of the blade 110 may have a shape substantially identical to the shape of the gap 24A of the sheet table 20. Alternatively, as shown in FIG. 5, the edge 110A of the blade 110 may have a shape linearly symmetric to the shape of the gap 24A. Furthermore, the edge 110A of the blade 110 may have a shape other than the shapes shown in FIGS. 4 and 5; for example, a double-edged blade as shown in FIG. 6. In addition, round tip processing may be applied to the edge 110A.

The blade 110 may be made from, for example, JIS standard SK, SKS, SKD, SKH, and SUS materials, austenitic stainless steels, martensitic stainless steels, or cemented carbides.

When the edge 110A of the blade 110 is pressed against the end portion 92A of the carrier film 92 (refer to FIG. 10), the carrier film 92 may be accidentally cut if the edge angle θ of the edge 110A is too narrow. In contrast, if the edge angle θ of the edge 110A is too wide, the fold line 92B (refer to FIG. 11) may fail to be formed.

In view of the above, the edge angle θ of the blade 110 may be within a range, for example, from 25° to 60°. Table 1 below shows relationships between the edge angles θ, successful peel-off rates, and cut-off chip generation rates. In this example, the edge 110A of a single edge type having the same shape as the gap 24A as shown in FIG. 4 was used. The blade 110 was made from a JIS standard SUS material. For each edge angle, two types of blades 110 were used, one to which round tip processing was applied to the edge 110A, and the other without such processing. For the lamination sheet 90, the carrier film 92 having a thickness of 50 μm and the sheet 94 having a thickness of 15 μm were used. In each of Examples 1 to 16, a peel-off process was performed 20 times.

TABLE 1

|  | Edge Angle | Round Tip Processing | Successful Peel-Off Rate | Chip Generation Rate |
| --- | --- | --- | --- | --- |
| Example 1 | 15° | Not applied | 0% | NA |
| Example 2 | 15° | Applied | 0% | NA |
| Example 3 | 20° | Not applied | 45% | 100% |
| Example 4 | 20° | Applied | 70% | 57% |
| Example 5 | 25° | Not applied | 90% | 6% |
| Example 6 | 25° | Applied | 100% | 0% |
| Example 7 | 30° | Not applied | 100% | 0% |
| Example 8 | 30° | Applied | 100% | 0% |
| Example 9 | 45° | Not applied | 100% | 0% |
| Example 10 | 45° | Applied | 100% | 0% |
| Example 11 | 60° | Not applied | 100% | 0% |
| Example 12 | 60° | Applied | 100% | 0% |
| Example 13 | 70° | Not applied | 45% | 0% |
| Example 14 | 70° | Applied | 20% | 0% |
| Example 15 | 75° | Not applied | 0% | NA |
| Example 16 | 75° | Applied | 0% | NA |

Table 1 indicates that the range of the edge angle θ with which the peel-off operation was successful and the generation of cut-off chips was reduced was from 25° to 60°.

As shown in FIG. 3, the clamp mechanism 120 clamps the end portion 92A of the carrier film 92 that has been folded upwards and moves with it to peel the carrier film 92 off from the sheet 94. The clamp mechanism 120 is supported by the z-axis table 66 via a clamp elevating mechanism 128. The clamp elevating mechanism 128 includes, for example, an air cylinder. The clamp mechanism 120 includes a raising claw 122, a clamping claw 124, and a slider 126.

The raising claw 122 faces the clamping claw 124 and clamps the carrier film 92 together with the clamping claw 124. Prior to the clamping, a film raising step is performed to raise the end portion 92A of the carrier film 92 using a protrusion 122A of the raising claw 122.

In a side view, the side surface of the raising claw 122 facing the clamping claw 124 may include, for example, an upper portion parallel to the z axis, and a tilted lower portion with a gradually decreasing width from the upper portion; in other words, tilted backwards. At the bottom portion, the raising claw 122 further includes the protrusion 122A that protrudes in parallel to the exposed raised surface of the lamination sheet 90. In other words, the protrusion 122A is formed to protrude towards the clamping claw 124 at the bottom of the raising claw 122.

Figure 12:
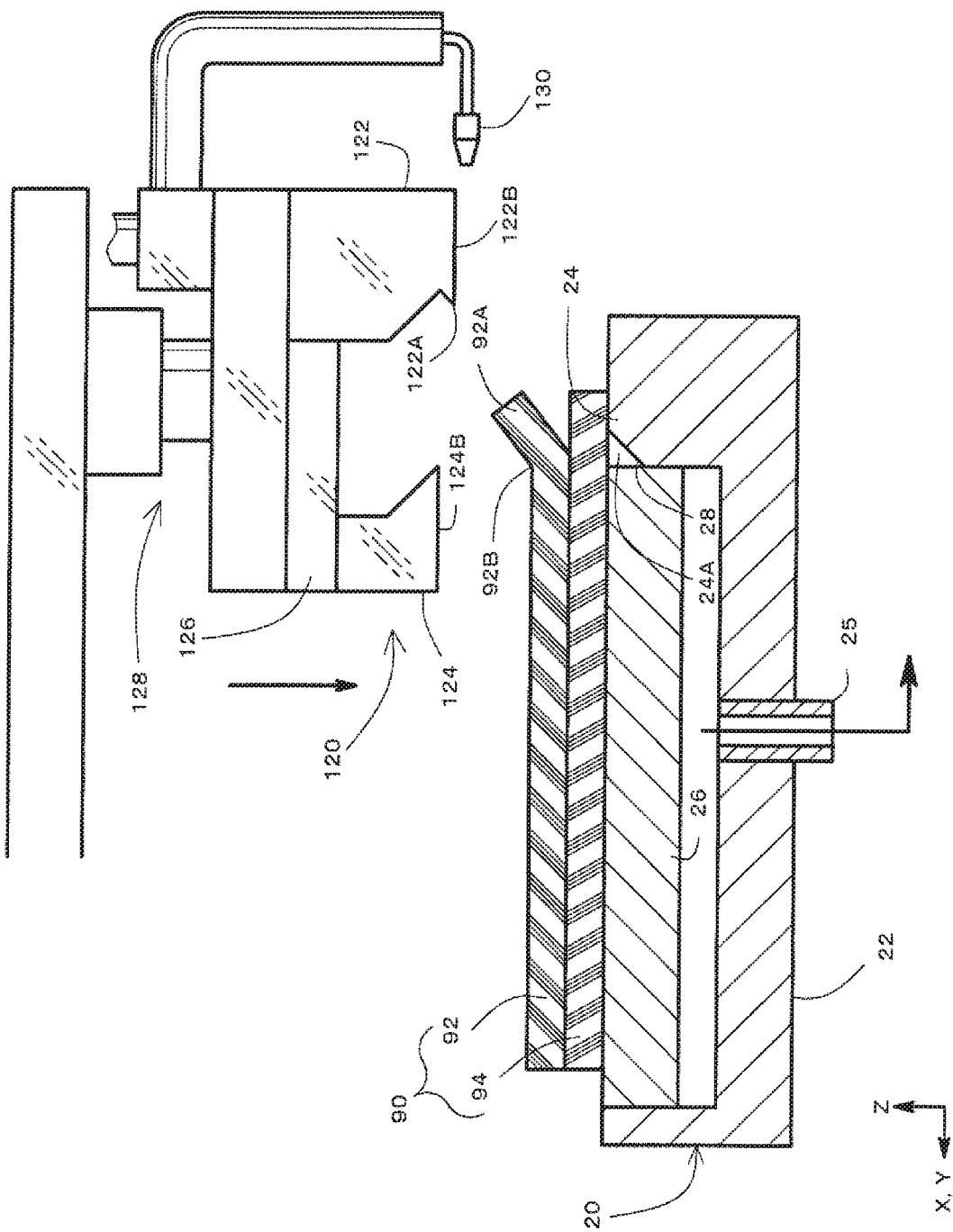
FIG. 12 exemplarily shows a peel-off process (4/7) of the carrier film performed by the peel-off device according to the embodiment of the present disclosure.

As shown in FIG. 12, a bottom 122B of the raising claw 122 is positioned lower than a bottom 124B of the clamping claw 124 for the height of the protrusion 122A. In the film raising step, because the protrusion 122A protrudes at a lower position than the clamping claw 124, the protrusion 122A can be pressed against the end portion 92A of the carrier film 92 with reduced interaction with the clamping claw 124.

In the film raising step, the protrusion 122A is positioned between the upwardly folded end portion 92A of the carrier film 92 and the sheet 94 while the protrusion 122A is spaced apart from the clamping claw 124; that is, in a clamp released state. As exemplarily shown in FIG. 13, the clamp mechanism 120 reciprocates in parallel to the exposed surface of the lamination sheet 90. During this reciprocation of the clamp mechanism 120, the protrusion 122A is pressed against the surface of the end portion 92A on the sheet 94 side to raise the end portion 92A. Then, the carrier film 92 is further peeled off from the sheet 94 towards an inner side from the end portion 92A.

The clamping claw 124 can be moved relative to the raising claw 122. For example, the clamping claw 124 is supported by the slider 126. The slider 126 reciprocates the clamping claw 124 in directions towards or away from the raising claw 122. The slider 126 includes, for example, an air cylinder. Alternatively, the slider 126 may include a linear motor mechanism.

Although in the present embodiment the raising claw 122 serves as a fixed claw, whereas the clamping claw 124 serves as a movable claw in the clamp mechanism 120, these roles may be reversed. Specifically, by supporting the raising claw 122 by the slider 126, the raising claw 122 may be the movable claw, whereas the clamping claw 124 may be the fixed claw.

The surface of the clamping claw 124 that faces the raising claw 122 has a shape that fits a surface of the raising claw 122 that faces the clamping claw 124. For example, in a side view, the surface of the clamping claw 124 facing the raising claw 122 includes an upper portion parallel to the z-axis, and a tilted lower portion with a gradually increasing width from the upper portion; in other words, protruding towards the raising claw 122.

The clamp mechanism 120 may include an air nozzle 130. The air nozzle 130 may include a jet outlet that is positioned lower than the bottom 122B of the raising claw 122. The air nozzle 130 may be moved up and down with the raising claw 122 and the clamping claw 124 by the clamp elevating mechanism 128.

As shown in FIG. 1, the controller 80 controls the motion of the sheet stage 10, the catcher stage 40, and the catcher unit 100 including the clamp mechanism 120. The controller 80 may be a computer that includes a CPU that performs arithmetic, a storage unit, such as a ROM or a memory, an input unit, such as a keyboard or a mouse, and an output unit 82, such as a display.

Figure 7:
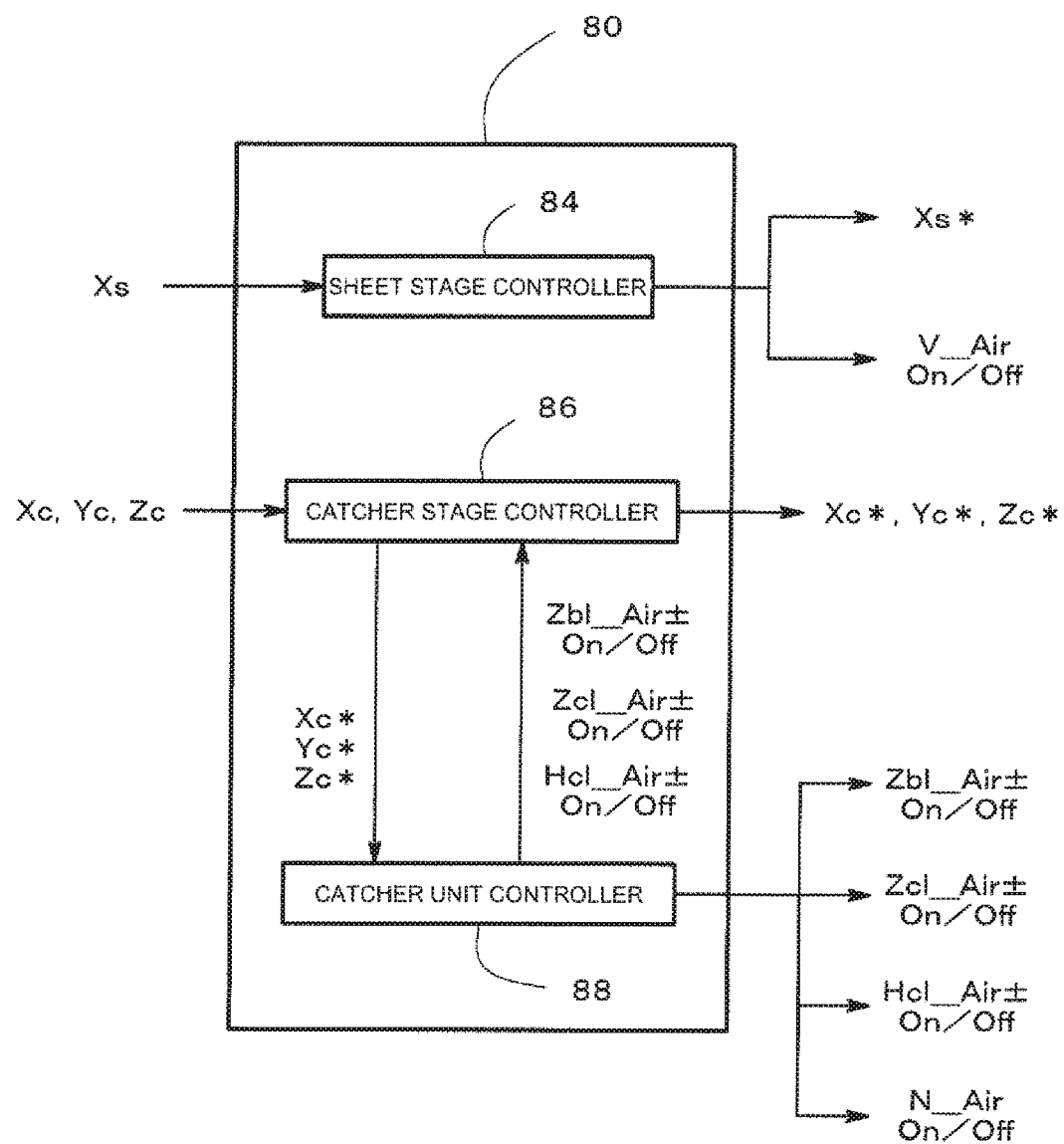
FIG. 7 exemplarily shows a function block of a controller.

The controller 80 may be configured to have a functional block exemplarily shown in FIG. 7 with the resources, such as the CPU and the storage unit, assigned accordingly. The controller 80 includes a sheet stage controller 84, a catcher stage controller 86, and a catcher unit controller 88.

The sheet stage controller 84 receives coordinates Xs of the sheet table 20 sent from a positional sensor or the like disposed at the sheet stage 10. In response to the receipt of the current coordinates Xs, the sheet stage controller 84 determines target coordinates Xs* and outputs a drive command to the sheet stage 10 accordingly. For example, the target coordinates Xs* may indicate a sheet receive position or a peel-off position on the x-axis rail 12.

The sheet stage controller 84 determines whether to create a negative pressure by forcing air out through the negative-pressure tube 25 (refer to FIG. 9) of the sheet table 20. For example, when the sheet table 20 is stopped at the sheet receiving position to receive the target lamination sheet 90, a negative pressure command V_Air is turned ON. The ON state of the V_Air is maintained until the sheet table 20 is moved to the peel-off position and returns to the sheet receiving position. When the sheet table 20 returns to the sheet receiving position, the sheet stage controller 84 turns the negative pressure command V_Air OFF. In this way, the suction of the sheet 94 is released and the sheet 94 is passed to an external holder or the like.

The catcher stage controller 86 monitors the three-dimensional position of the catcher unit 100 to move the catcher unit 100 as required. The catcher stage controller 86 receives three-dimensional coordinates (Xc, Yc, Zc) of the catcher unit 100 sent from the catcher stage 40. In response to the receipt of the current coordinates (Xc, Yc, Zc) of the catcher unit 100, the catcher stage controller 86 determines target coordinates (Xc*, Yc*, Zc*) and outputs a drive command to the catcher stage 40 accordingly.

For example, the target coordinates (Xc*, Yc*, Zc*) are determined so that the blade 110 is positioned over the peel-off position when the sheet stage 10 reaches the peel-off position. Specifically, the target coordinates (Xc*, Yc*, Zc*) are determined so that the blade 110 is positioned over the end portion 92A of the lamination sheet 90 such that the blade 110 is positioned across a corner over two adjoining sides of the lamination sheet 90 (the carrier film 92) as shown in FIG. 3.

The catcher unit controller 88 controls the motion of the blade 110 and the clamp mechanism 120. For example, regarding the blade 110, the catcher stage controller 86 sends a signal to the catcher unit controller 88 to notify that the catcher unit 100 has reached the target coordinates (Xc*, Yc*, Zc*). In response to the receipt of this signal, the catcher unit controller 88 outputs a lower command Zbl_Air− to an air cylinder of the blade elevating mechanism 112 to lower the blade 110 at a predetermined thrust. Then, the blade 110 is lowered to form the fold line 92B at the end portion 92A of the carrier film 92. After the fold line 92B has been formed, the catcher unit controller 88 outputs a raise command Zbl_Air+ to the air cylinder of the blade elevating mechanism 112 to lift the blade 110.

With reference to FIG. 3, the catcher unit controller 88 outputs the raise command Zcl_Air+ and the lower command Zcl_Air− to the clamp elevating mechanism 128. For example, when the blade 110 is lifted after forming the fold line 92B in the carrier film 92, the catcher unit controller 88 outputs the lower command Zcl_Air− to the clamp elevating mechanism 128. Then, when the peel-off process is completed, the catcher unit controller 88 outputs the raise command Zcl_Air+ to the clamp elevating mechanism 128.

The catcher unit controller 88 also outputs a horizontal move command Hcl_Air± to the slider 126. For example, in order to clamp the end portion 92A of the carrier film 92 with the raising claw 122 and the clamping claw 124, the catcher unit controller 88 outputs an approach command Hcl_Air+ to the slider 126. In order to release the end portion 92A, the catcher unit controller 88 outputs a retract command Hcl_Air− to the slider 126.

Furthermore, the catcher unit controller 88 determines ON or OFF of a jet command N_Air to the air nozzle 130. For example, the catcher unit controller 88 turns the jet command N_Air from OFF to ON when outputting the lower command Zcl_Air− to the clamp elevating mechanism 128. The catcher unit controller 88 switches the jet command N_Air from ON to OFF when outputting the raise command Zcl_Air+ to the clamp elevating mechanism 128.

Peel-Off Process

Figure 8:
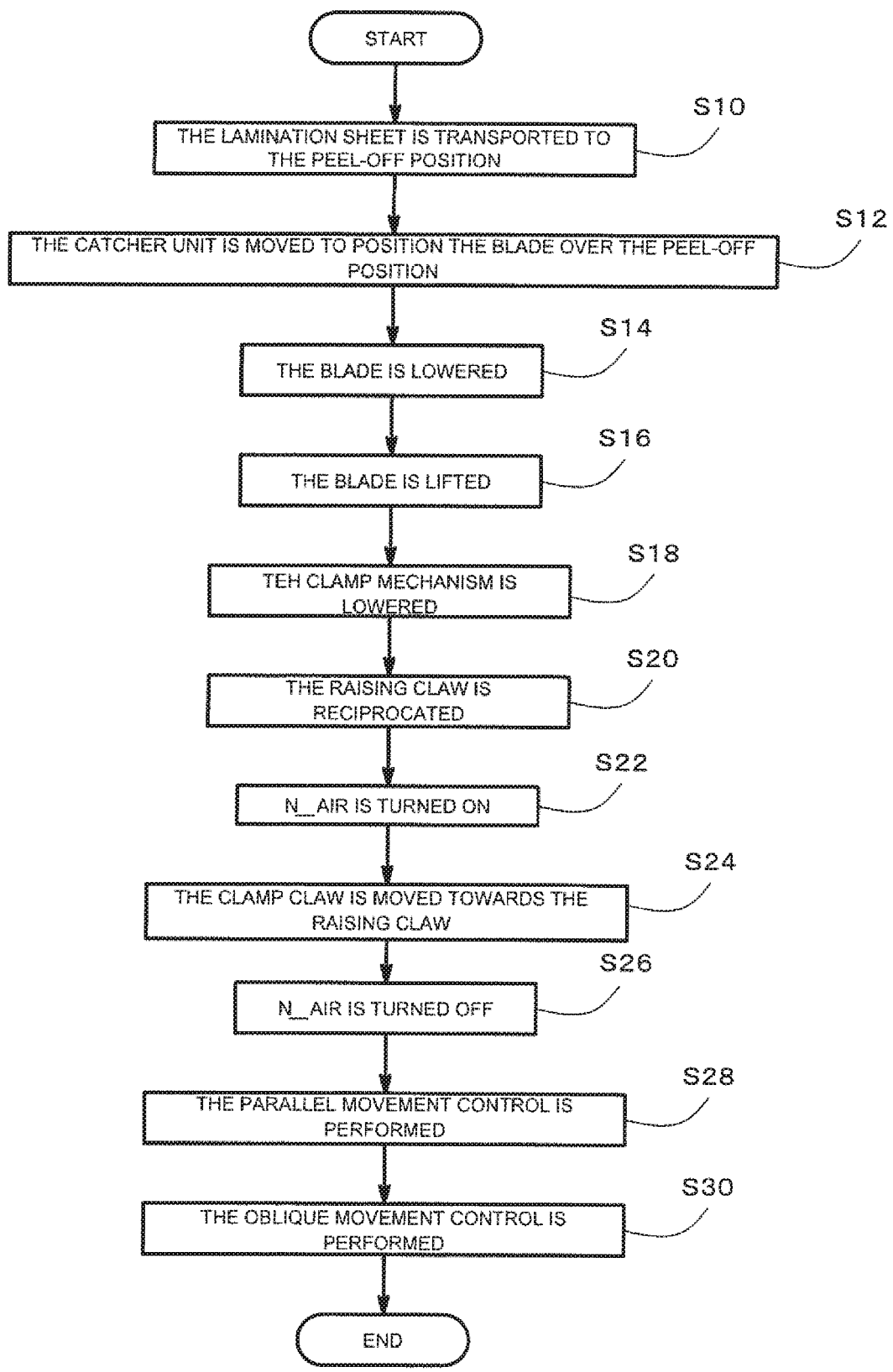
FIG. 8 is a flowchart exemplarily showing a peel-off flow performed by the controller.

FIG. 8 exemplarily shows a peel-off flow of the carrier film 92 by the peel-off device according to the present embodiment. This peel-off flow is controlled by the controller 80. FIGS. 9 to 17 exemplarily show peel-off steps according to the peel-off flow. In FIGS. 9 to 17, the fold line 92B is formed at 45 degrees to the X and Y axes. Accordingly, the blade 110 and the facing surfaces of the raising claw 122 and the clamping claw 124 are disposed at 45 degrees to the X and Y axes. FIGS. 9 to 15, and 17 show a side view with these elements oriented in such a manner. Side views of the blade 110, and facing surfaces of the raising claw 122 and the clamping claw 124 are exemplarily shown. In these views, the X axis and the Y axis are overlapped with each other.

As described above, the sheet table 20 carries the lamination sheet 90 to a predetermined peel-off position while suctioning the lamination sheet 90 with the sheet 94 used as a suctioned surface and the carrier film 92 as an exposed surface (S10). Then, the catcher stage controller 86 controls the catcher unit 100 to move to a position where the blade 110 is positioned over the peel-off position (S12). Specifically, as exemplarily shown in FIG. 3, the blade 110 is positioned at the end portion 92A of the carrier film 92 where no patterned conductors 96 are formed such that the blade 110 is positioned across a corner over two adjoining sides of the carrier film 92.

As exemplarily shown in FIG. 9, the blade elevating mechanism 112 lowers the blade 110 (S14). When the edge 110A of the blade 110 reaches the exposed surface of the carrier film 92, the lamination sheet 90 is pressed downward by the blade 110 with a thrust of the blade elevating mechanism 112.

Figure 10:
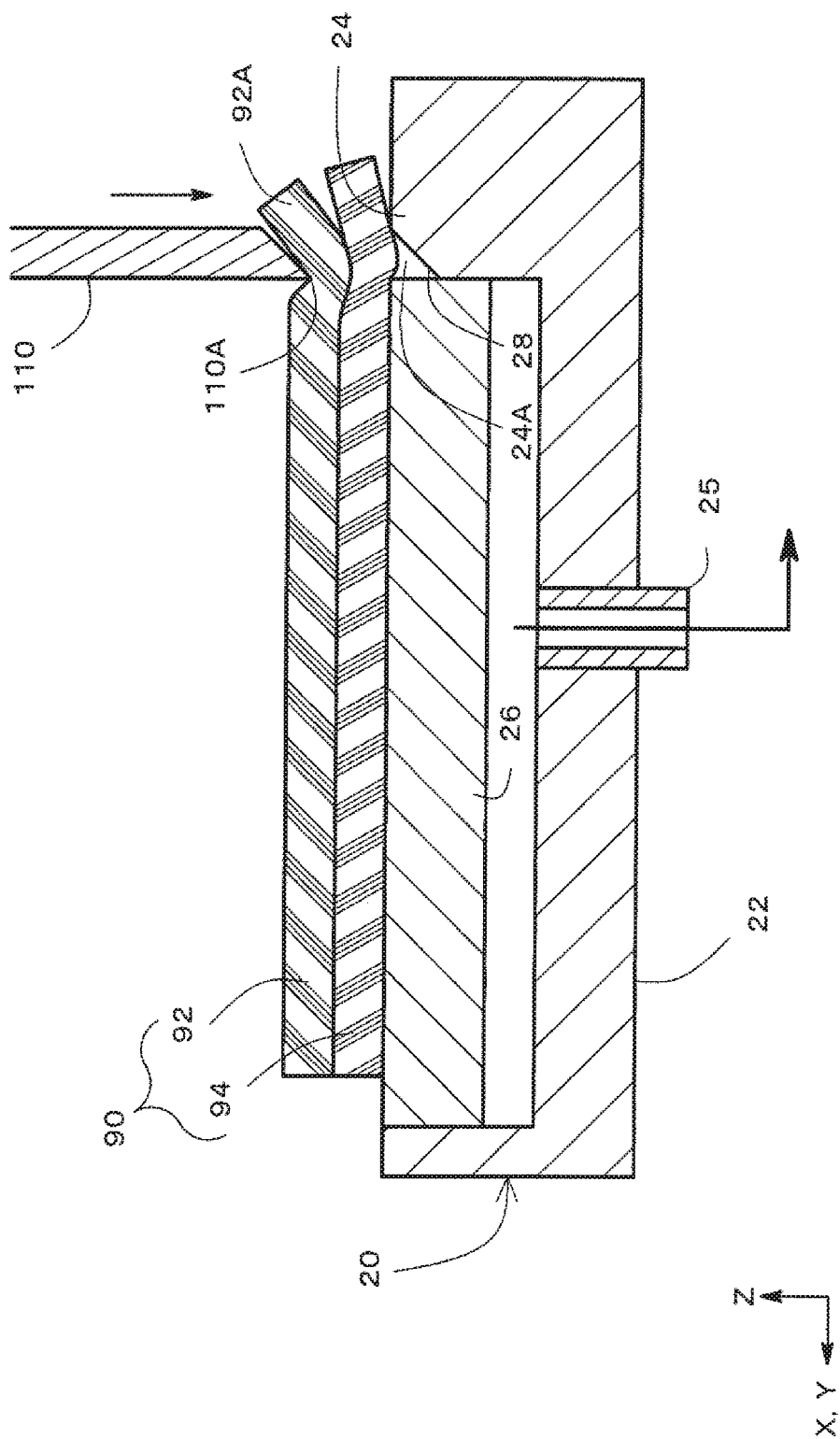
FIG. 10 exemplarily shows a peel-off process (2/7) of the carrier film performed by the peel-off device according to the embodiment of the present disclosure.

As shown in FIG. 10, the gap 24A is formed in the sheet table 20 at a position corresponding to the blade 110. The lamination sheet 90 is pressed into the gap 24A.

Figure 11:
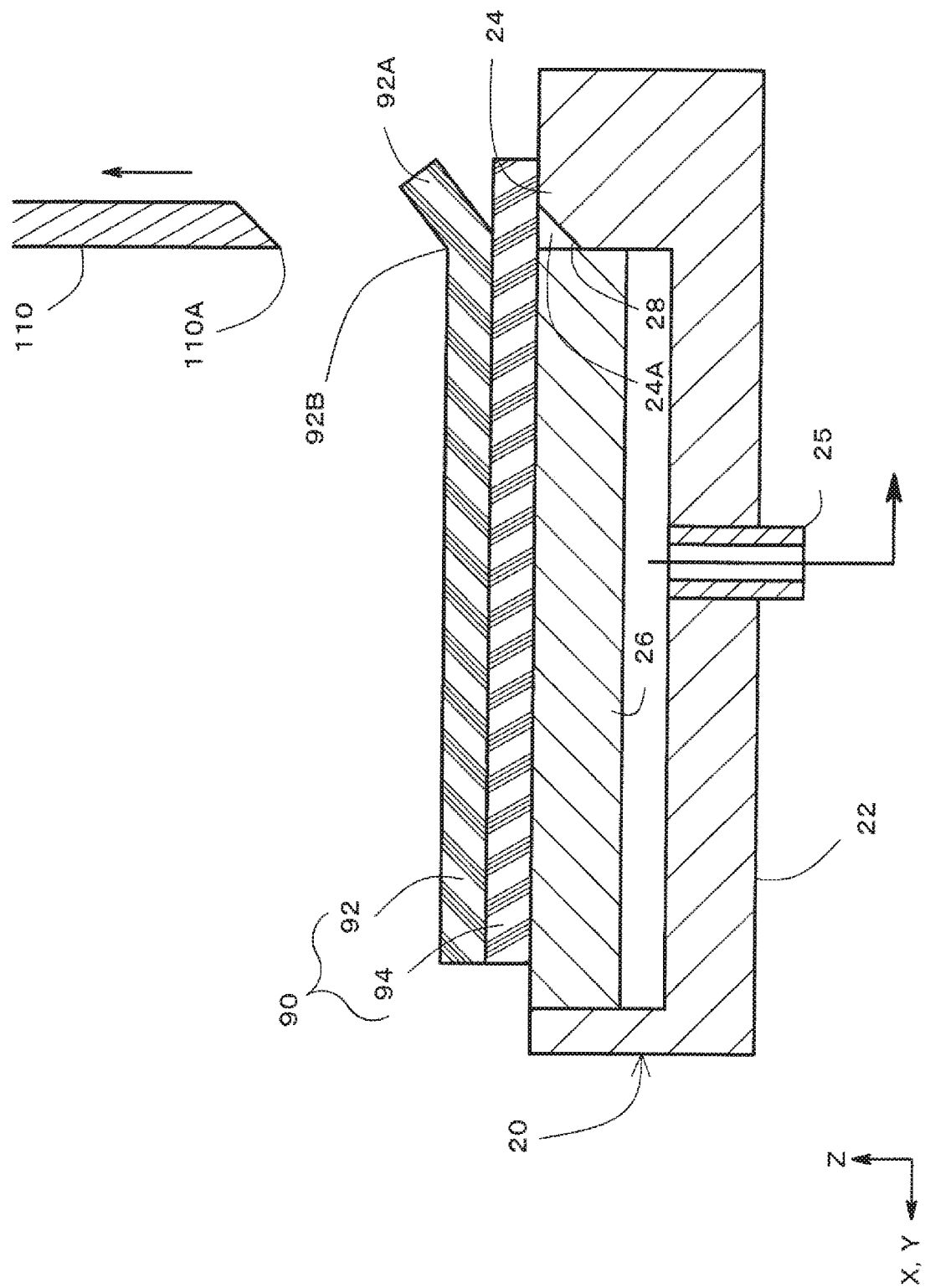
FIG. 11 exemplarily shows a peel-off process (3/7) of the carrier film performed by the peel-off device according to the embodiment of the present disclosure.

During this pressing, the fold line 92B as exemplarily shown in FIG. 11 is formed at the end portion 92A of the carrier film 92 against which the edge 110A of the blade 110 is pressed, and the end portion 92A on the outer side from the fold line 92B is fold upwards from the sheet 94.

In summary, the carrier film 92 is plastically deformed by pressing the edge 110A of the blade 110 against the carrier film 92. By such a plastic deformation (upward folding), the end portion 92A can be maintained to be separated from the sheet 94.

After maintaining the pressed state for a predetermined time period, the blade elevating mechanism 112 lifts the blade 110 (S16). It should be noted that steps S14 and S16 may be repeated two or more times to ensure the formation of the fold line 92B.

As exemplarily shown in FIG. 12, the clamp mechanism 120 is lowered by the clamp elevating mechanism 128 while the raising claw 122 and the clamping claw 124 are separated from each other (S18), such that the protrusion 122A of the raising claw 122 is positioned in a gap between the end portion 92A of the carrier film 92 and the sheet 94.

After the clamp mechanism 120 is lowered, a film raising control is performed to promote the peel off of the carrier film 92 from the sheet 94. Specifically, the clamp mechanism 120 is reciprocated (S20). The moving direction is set to be in parallel to the exposed surface of the lamination sheet 90. The moving direction of the clamp mechanism 120 is determined such that the direction is perpendicular to the fold line 92B on the exposed surface. For example, by driving the x-axis stage 52 and the y-axis stage 42 of the catcher stage 40, the clamp mechanism 120 is reciprocated at 45 degrees to the X and Y-axes in parallel to the horizontal plane.

Figure 13:
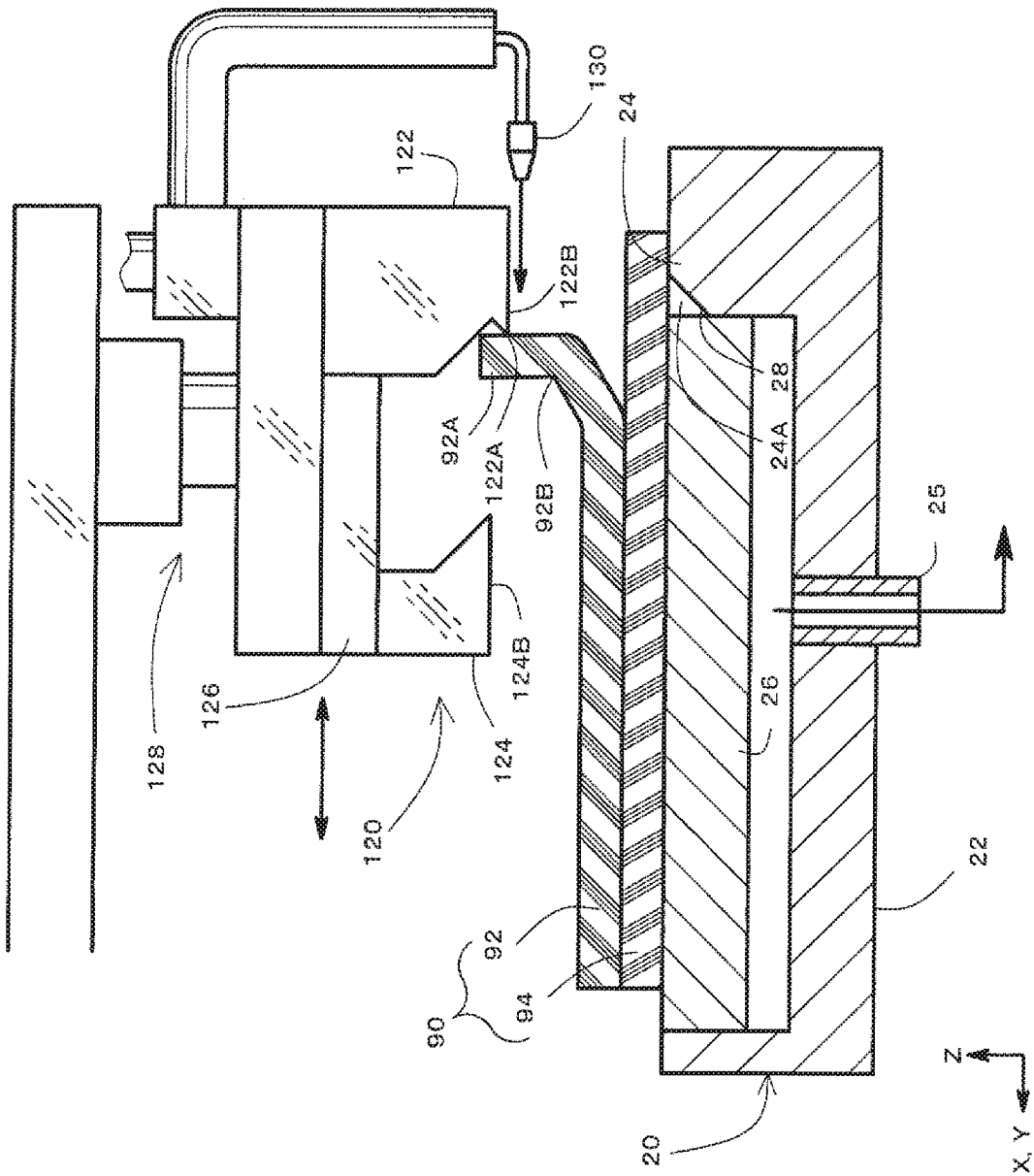
FIG. 13 exemplarily shows a peel-off process (5/7) of the carrier film performed by the peel-off device according to the embodiment of the present disclosure.

As shown in FIG. 13, because the protrusion 122A of the raising claw 122 catches the end portion 92A and moves horizontally, the end portion 92A is raised further. In this way, the carrier film 92 is further peeled off from the sheet 94 towards the inner side from the end portion 92A.

During the film raising control, air may be jetted from the air nozzle 130 to the gap between the end portion 92A and the sheet 94 (S22). According to the air jet, the peeling off process can be promoted.

After the film raising control, the carrier film 92 is clamped by the clamp mechanism 120. Specifically, the slider 126 moves the clamping claw 124 towards the raising claw 122 (S24). For example, the catcher unit controller 88 sends the approach command Hcl_Air+ to the slider 126. The air jet from the air nozzle 130 is stopped at this occasion (S26).

During the film raising control, the end portion 92A of the carrier film 92 is hooked by the raising claw 122. When the clamping claw 124 approaches the raising claw 122, the end portion 92A of the carrier film 92 is clamped (held) between the raising claw 122 and the clamping claw 124 as a result.

Figure 14:
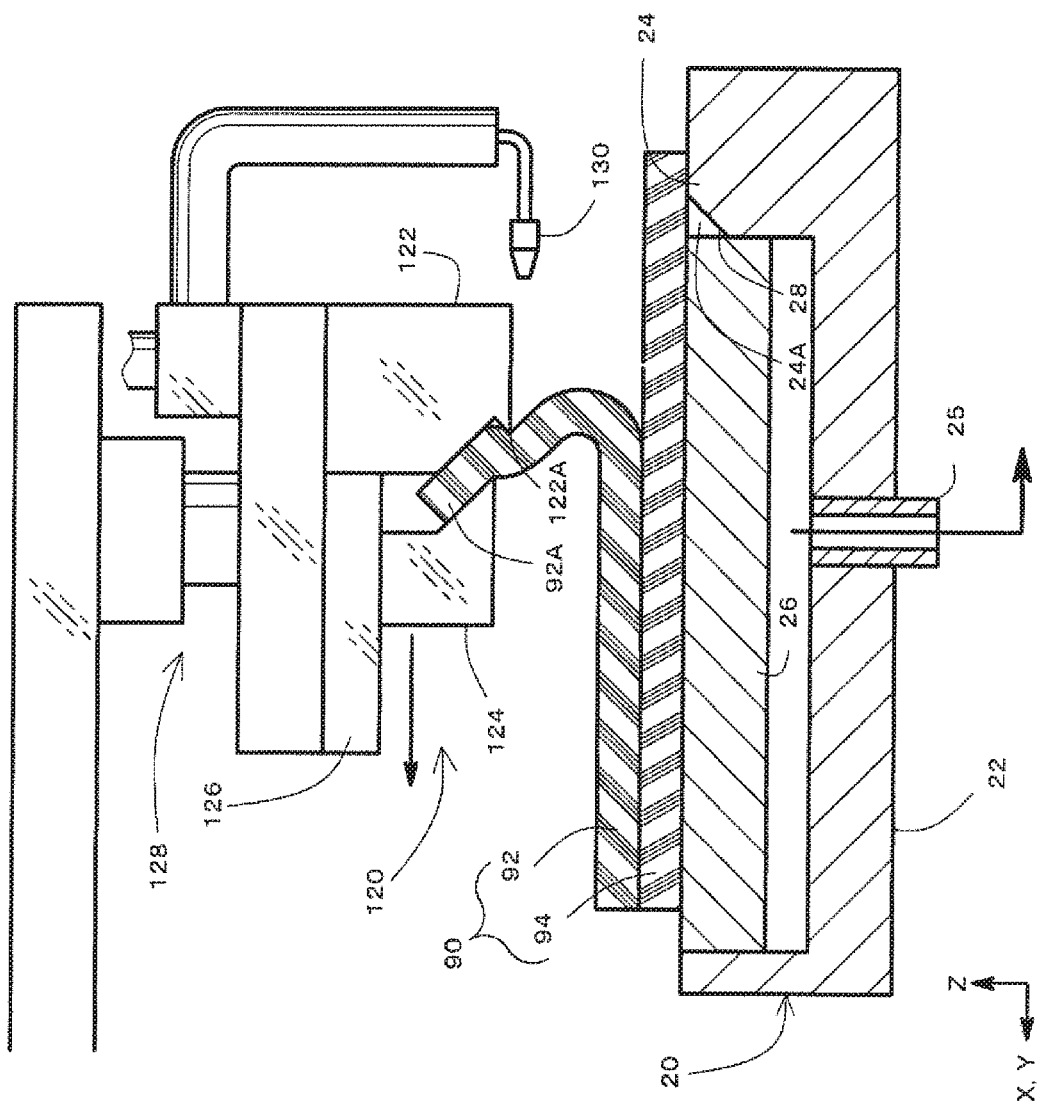
FIG. 14 exemplarily shows a peel-off process (6/7) of the carrier film performed by the peel-off device according to the embodiment of the present disclosure.

As shown in FIG. 14, the clamp mechanism 120 is moved in parallel to the exposed surface of the lamination sheet 90 with the carrier film 92 being clamped (S28). For example, the x-axis stage 52 and the y-axis stage 42 of the catcher stage 40 are driven such that the clamp mechanism 120 is positioned at 45 degrees to the x and y axes in parallel to the exposed surface of the lamination sheet 90; for example, in parallel to the horizontal plane. In contrast to the film raising control, in the parallel control, the movement of the clamp mechanism 120 is not reciprocating but one way. The movement direction in this step is determined to be perpendicular to the fold line 92B in the exposed surface.

For example, the moving speeds of the x-axis table 56 of the x-axis stage 52 and the y-axis table 46 of the y-axis stage 42 are set within a range from 1 mm/sec to 50 mm/sec. In the parallel movement control, the movement speed of the z-axis table 66 of the z-axis stage 62 is set at 0 mm/sec.

In the parallel movement control, the movement is not limited to a perfect parallel movement; that is, a movement with no displacement along the z axis. Specifically, a slight movement along the z axis may be allowed. The movement speed of the z-axis table 66 may be set, for example, from 0 mm/sec to 10 mm/sec.

Figure 15:
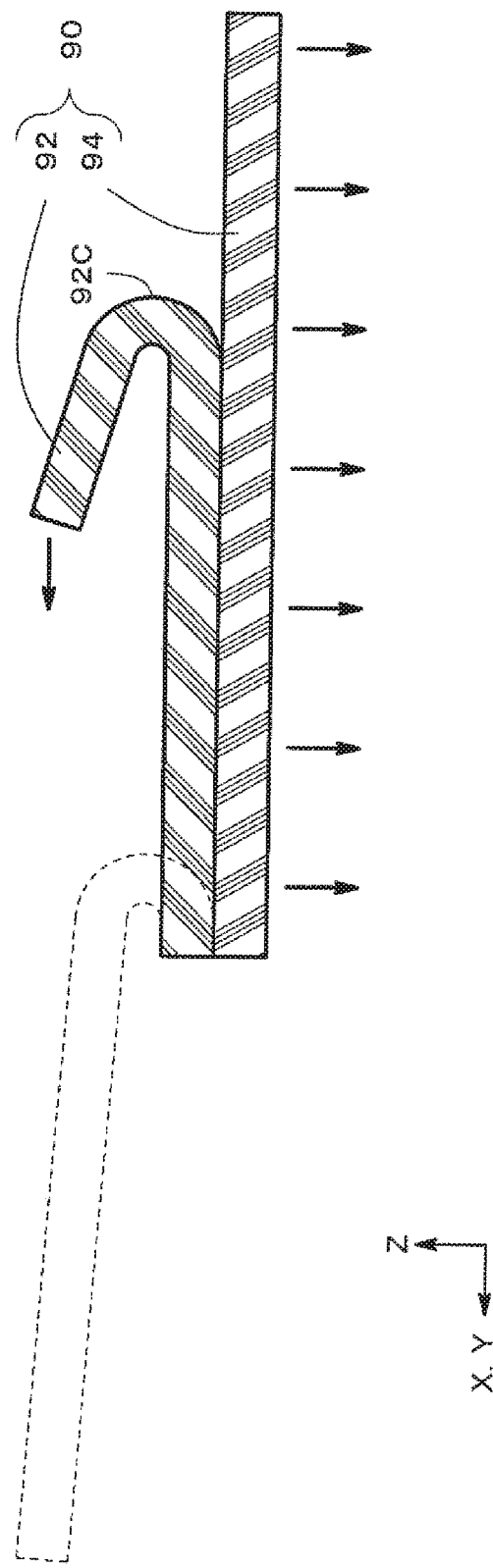
FIG. 15 is a diagram (1/2) to describe a peel-off direction of the carrier film.

As shown in FIG. 15, when the carrier film 92 is peeled off in parallel to the exposed surface of the lamination sheet 90, a bent portion 92C is formed in the carrier film 92. When the bent portion 92C is sharply curved at a high curvature (a small curvature radius) as shown in the broken line in FIG. 15, a peel-off trailing end portion of the carrier film 92 may damage the sheet 94 while springing back.

In order to decrease the curvature (enlarge the curvature radius) of the bent portion 92C of the carrier film 92, the carrier film 92 may be lifted up not in parallel to the exposed surface of the lamination sheet 90, but vertically. However, in such a peel-off process, because the lamination sheet 90 is suctioned downward with a negative pressure from the sheet table 20, when the carrier film 92 is vertically raised, a force in a direction opposite to the suction direction is applied to the lamination sheet 90. As a result, the lamination sheet 90 may be detached from the sheet table 20.

In the peel-off process according to the present embodiment, the parallel movement control is performed in an earlier stage of the peeling off process of the carrier film 92, and then, an oblique movement control is performed in a later stage of the peeling off process. The above described damage of the sheet 94 caused by springing back of the trailing end portion of the carrier film 92 does not occur in the earlier stage of the peel-off process. For this reason, the parallel movement control is performed to peel off the carrier film 92 in parallel to the exposed surface of the lamination sheet 90 in the earlier stage of the peel-off process.

In order to avoid damage of the sheet 94 caused by springing back of the trailing end portion of the carrier film 92, the controller 80 performs the oblique movement control shown in FIG. 17 to the clamp mechanism 120 in the later stage of the peeling off process such that the clamp mechanism 120 is moved away from the exposed surface of the lamination sheet 90 in a direction that is tilted with respect to the exposed surface of the lamination sheet 90 (S30 in FIG. 8).

During the oblique movement control, the lamination sheet 90 may be detached from the sheet table 20 as described above. In order to reduce the required force that upwardly pulls the lamination sheet 90, as exemplarily shown in FIG. 16, the oblique movement control is started at a position where the length of the front line of the carrier film 92 to be peeled off from the sheet 94 (the boundary between the area in which the carrier film 92 is attached to the sheet 94 and the area where the carrier film 92 is separated from the sheet 94) relatively decreases.

As shown in FIG. 16, in the peel-off process according to the present embodiment, a peel-off path extends on, for example, a diagonal L1 of the lamination sheet 90. Thus, up to the cross point with the other diagonal L2, the length of the peel-off front line L3 becomes longer as the peel-off front line L3 approaches the other diagonal L2. After passing the other diagonal, the length gradually reduces with the distance from the other diagonal L2.

In this case, the upward pulling force applied to the lamination sheet 90 reaches the maximum when the peel-off front line L3 crosses the other diagonal L2. The parallel movement control may be switched to the oblique movement control after the front line L3 passing the diagonal L2.

In the oblique movement control, the speed of the x-axis table 56 of the x-axis stage 52 and the speed of the y-axis table 46 of the y-axis stage 42 are set within the range from 1 mm/sec to 50 mm/sec. The speed of the z-axis table 66 of the z-axis stage 62 is set within the range from 10 mm/sec to 100 mm/sec.

Figure 17:
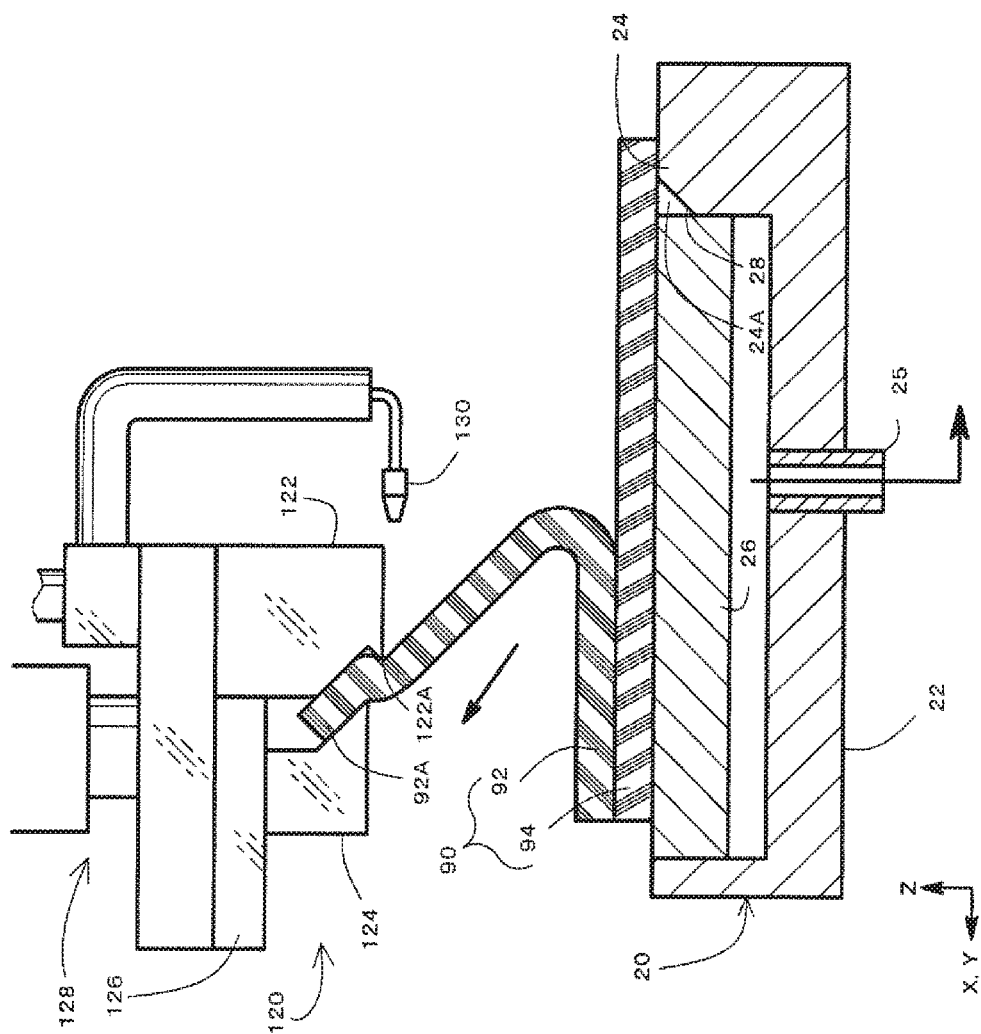
FIG. 17 exemplarily shows a peel-off process (7/7) of the carrier film performed by the peel-off device according to the embodiment of the present disclosure.

With reference to FIG. 17, when the carrier film 92 is completely separated from the sheet 94, the clamp mechanism 120 carries the carrier film 92 to a designated film collection bin (not shown). Then, clamping between the clamping claw 124 and the raising claw 122 is released to discard the carrier film 92.

During the above process, the sheet table 20 carries the sheet 94 from which the carrier film 92 has been peeled off to a predetermined delivery position (not shown) where the vacuum suction is turned OFF (V_Air Off) to release the sheet 94. Upon this release, a holder (not shown) receives the sheet 94.

Another Embodiment of Peel-Off Device According to Present Disclosure

Figure 18:
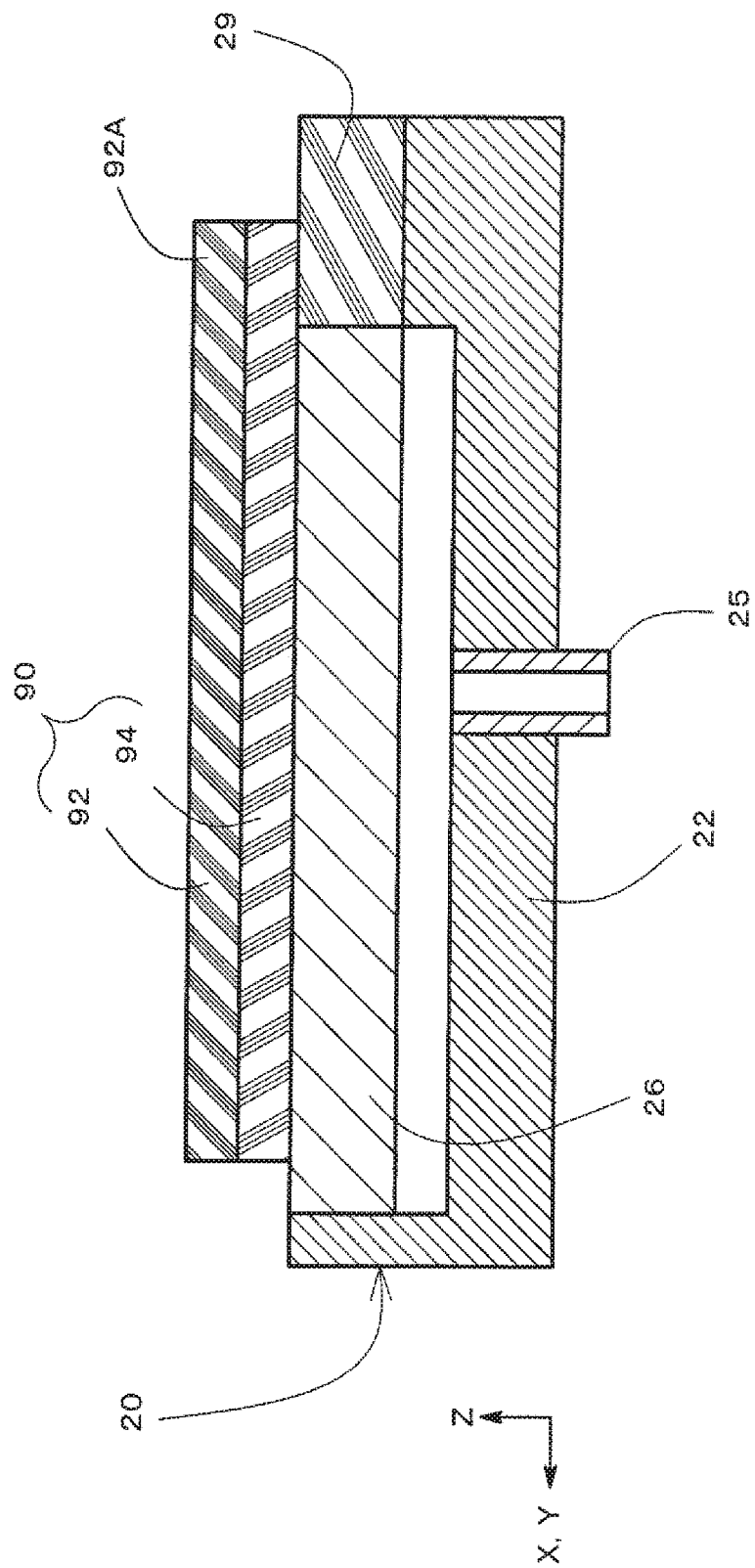
FIG. 18 shows another embodiment of the sheet table.

Although in the above described embodiment the gap 24A is provided in the sheet table 20 as shown in FIG. 4, peel-off devices according to the present disclosure are not limited to this embodiment so long as the lamination sheet 90 can be pressed downward (to the table side) when the blade 110 is pressed. For example, as exemplarily shown in FIG. 18, an elastic sheet 29 may be disposed at a location corresponding to the end portion 92A of the carrier film 92.

Another Embodiment of Peel-Off Process

Although in the above embodiments the peel-off path L1 is formed on the diagonal of the lamination sheet 90 as shown in FIG. 16, peel-off processes according to the present disclosure are not limited to these embodiments. As exemplarily shown in FIG. 19, the peel-off path may be formed in parallel to one side of the lamination sheet 90, and the fold line 92B is provided in parallel to another side of the lamination sheet 90 such that the peel-off path is orthogonal to the fold line 92B. The horizontal movement control may be switched to the oblique movement control when passing the center of the one side of the lamination sheet 90.

The present disclosure is not limited to the present embodiments described above, and includes all changes and modifications without departing from the technical scope or the essence of the present disclosure defined by the claims.

The invention claimed is:

1. A peel-off device comprising:
    a sheet table configured to suction a lamination sheet, the lamination sheet including a sheet laminated with a carrier film, the carrier film being a base layer, a surface of the sheet being a suction surface of the lamination sheet, and a surface of the carrier film being an exposed surface of the lamination sheet, the sheet table including a suction generating surface extending in a first direction and a chamfer portion with a tilted surface extending in a second direction different from the first direction so as to create a gap between the suction generating surface and the tilted surface of the chamfer portion;
    a blade including an edge configured to press against an end portion of the carrier film to fold the end portion upwards from the sheet at a position between the blade and the chamfer portion of the sheet table; and
    a clamp mechanism configured to peel the carrier film off of the sheet by moving while clamping the end portion of the upwardly folded carrier film.

2. The peel-off device according to claim 1, further comprising:
    an elevator configured to lower the blade toward the exposed surface.

3. The peel-off device according to claim 1, wherein an edge angle of the blade is within a range of 25° to 60°.

4. The peel-off device according to claim 1, further comprising a controller configured to control the clamp mechanism, the controller being configured to perform:
    a parallel movement control operation including controlling the clamp mechanism to move in parallel to the exposed surface of the lamination sheet after the end portion of the carrier film is clamped by the clamp mechanism, and
    an oblique movement control operation including controlling the clamp mechanism to move away from the exposed surface in a tilted direction with respect to the exposed surface after performing the parallel movement control operation.

5. The peel-off device according to claim 4, wherein:
    the clamp mechanism includes:
        a raising claw including a protrusion protruding in parallel to the exposed surface of the lamination sheet, and
        a clamping claw facing the raising claw and moveable relative to the raising claw,
    the controller is configured to perform a film raising control operation that causes peeling off of the carrier film from the sheet before performing the parallel movement control operation, and
    during the film raising control operation, the controller (i) positions the protrusion of the raising claw in a gap between the end portion of the carrier film and the sheet when the raising claw is spaced apart from the clamping claw, and (ii) reciprocates the raising claw in a parallel direction to the exposed surface of the lamination sheet.

6. The peel-off device according to claim 5, further comprising an air nozzle configured to jet air into the gap between the end portion of the carrier film and the sheet during the film raising control operation.

7. The peel-off device according to claim 1, wherein the blade is configured to fold the end portion upwards from the sheet with a force applied in a direction normal to the exposed surface and into the carrier film.

* * * * *